US011272622B2

(12) United States Patent
Matsumura et al.

(10) Patent No.: US 11,272,622 B2
(45) Date of Patent: Mar. 8, 2022

(54) METHOD FOR PRODUCING CIRCUIT BOARD AND METHOD FOR PRODUCING INTEGRATED CIRCUIT INCLUDING THE SAME

(71) Applicant: FUJIFILM Business Innovation Corp., Tokyo (JP)

(72) Inventors: Yasuo Matsumura, Kanagawa (JP); Sumiaki Yamasaki, Kanagawa (JP); Tsuyoshi Murakami, Kanagawa (JP); Kana Yoshida, Kanagawa (JP); Shuji Sato, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 281 days.

(21) Appl. No.: 16/253,226

(22) Filed: Jan. 22, 2019

(65) Prior Publication Data

US 2020/0093004 A1 Mar. 19, 2020

(30) Foreign Application Priority Data

Sep. 13, 2018 (JP) .............................. JP2018-171873

(51) Int. Cl.
*H05K 3/12* (2006.01)
*H05K 3/02* (2006.01)
*H05K 1/18* (2006.01)
*H05K 1/02* (2006.01)

(52) U.S. Cl.
CPC ......... *H05K 3/1266* (2013.01); *H05K 1/0298* (2013.01); *H05K 1/188* (2013.01); *H05K 3/025* (2013.01)

(58) Field of Classification Search
CPC ................. H05K 1/0298; H05K 1/188; H05K 2201/0129; H05K 2203/0517; H05K 2203/0522; H05K 2203/1545; H05K 3/025; H05K 3/046; H05K 3/1266
See application file for complete search history.

(56) References Cited

U.S. PATENT DOCUMENTS

| 7,560,215 | B2 * | 7/2009 | Sharma | H04L 45/60 |
| | | | | 430/117.4 |
| 8,652,742 | B2 * | 2/2014 | Matsushima | G03G 15/1605 |
| | | | | 430/125.31 |
| 8,844,832 | B2 | 9/2014 | Matsumoto et al. | |
| 10,852,659 | B2 * | 12/2020 | Matsumura | H01L 21/4867 |
| 2005/0153249 | A1 * | 7/2005 | Yamaguchi | H05K 3/102 |
| | | | | 430/330 |
| 2010/0159648 | A1 * | 6/2010 | Tombs | G03G 15/1625 |
| | | | | 438/129 |
| 2012/0110843 | A1 * | 5/2012 | Tombs | G03G 15/6591 |
| | | | | 29/847 |
| 2020/0093004 | A1 * | 3/2020 | Matsumura | H05K 3/046 |

FOREIGN PATENT DOCUMENTS

| JP | 2004095648 | 3/2004 |
| JP | 2011238837 | 11/2011 |
| JP | 2013015953 | 1/2013 |

* cited by examiner

*Primary Examiner* — Minh N Trinh
(74) *Attorney, Agent, or Firm* — JCIPRNET

(57) ABSTRACT

A method for producing a circuit board includes providing a substrate on which a toner image formed of a thermoplastic toner has been formed and forming a conductive foil layer having a thickness of 0.1 μm to 2 μm on the toner image that has been formed on the substrate and then applying heat to the toner image and the conductive foil layer to form a wire constituted by conductive foil.

14 Claims, 8 Drawing Sheets

METHOD FOR PRODUCING CIRCUIT BOARD AND METHOD FOR PRODUCING INTEGRATED CIRCUIT INCLUDING THE SAME

CROSS-REFERENCE TO RELATED APPLICATIONS

This application is based on and claims priority under 35 USC 119 from Japanese Patent Application No. 2018-171873 filed Sep. 13, 2018.

BACKGROUND

(i) Technical Field

The present disclosure relates to a method for producing a circuit board and a circuit board producing apparatus, and a method for producing an integrated circuit using the method and the apparatus.

(ii) Related Art

Japanese Laid Opened Patent Application Publication No. 2011-238837 discloses "a method for producing a circuit board and an apparatus including an electrostatic latent image carrier, a developing unit, and a transferring unit that transfers a developer onto a transfer body, wherein the developer is conductive particles and an adhesive is applied to a surface of the transfer body, the method including a step of bringing the electrostatic latent image carrier having a surface on which the conductive particles are held into contact with the adhesive to cause adhesive transfer".

Japanese Laid Opened Patent Application Publication No. 2013-015953 discloses "a method for producing a non-contact information recording medium by forming an antenna circuit on a recording substrate in which an IC module is embedded and connecting the antenna circuit to the IC module through a connecting terminal, the method including a step of forming a foil bonding resin layer to which an antenna circuit is to be bonded while being in contact with at least a connecting terminal on a recording substrate in which an IC module connected to a connecting terminal is embedded by electrophotography using a toner containing a binder resin and connecting an antenna circuit to the connecting terminal by contacting and bonding a conductive foil onto the foil bonding resin layer through at least application of pressure to form an antenna circuit made of the conductive foil".

Japanese Unexamined Patent Application Publication No. 2004-095648 discloses "a method for forming a conductive circuit, the method including forming a conductive circuit by using a toner or a developer used in an electrophotographic process as a resist agent".

SUMMARY

In the related art, in a method for producing a circuit board in which a toner image formed of a thermoplastic toner is formed on a substrate and a conductive foil is bonded to the toner image, the resistance stability of wires formed tends to be low. Aspects of non-limiting embodiments of the present disclosure relate to a method for producing a circuit board including a wire having high resistance stability compared with the case where a conductive foil having a thickness of less than 0.1 µm or more than 2 µm is formed.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a method for producing a circuit board, the method including providing a substrate on which a toner image formed of a thermoplastic toner has been formed; and forming a conductive foil layer having a thickness of 0.1 µm to 2 µm on the toner image that has been formed on the substrate and then applying heat to the toner image and the conductive foil layer to form a wire constituted by conductive foil.

BRIEF DESCRIPTION OF THE DRAWINGS

An exemplary embodiment of the present disclosure will be described in detail based on the following figures, wherein.

DETAILED DESCRIPTION

Figure 1:
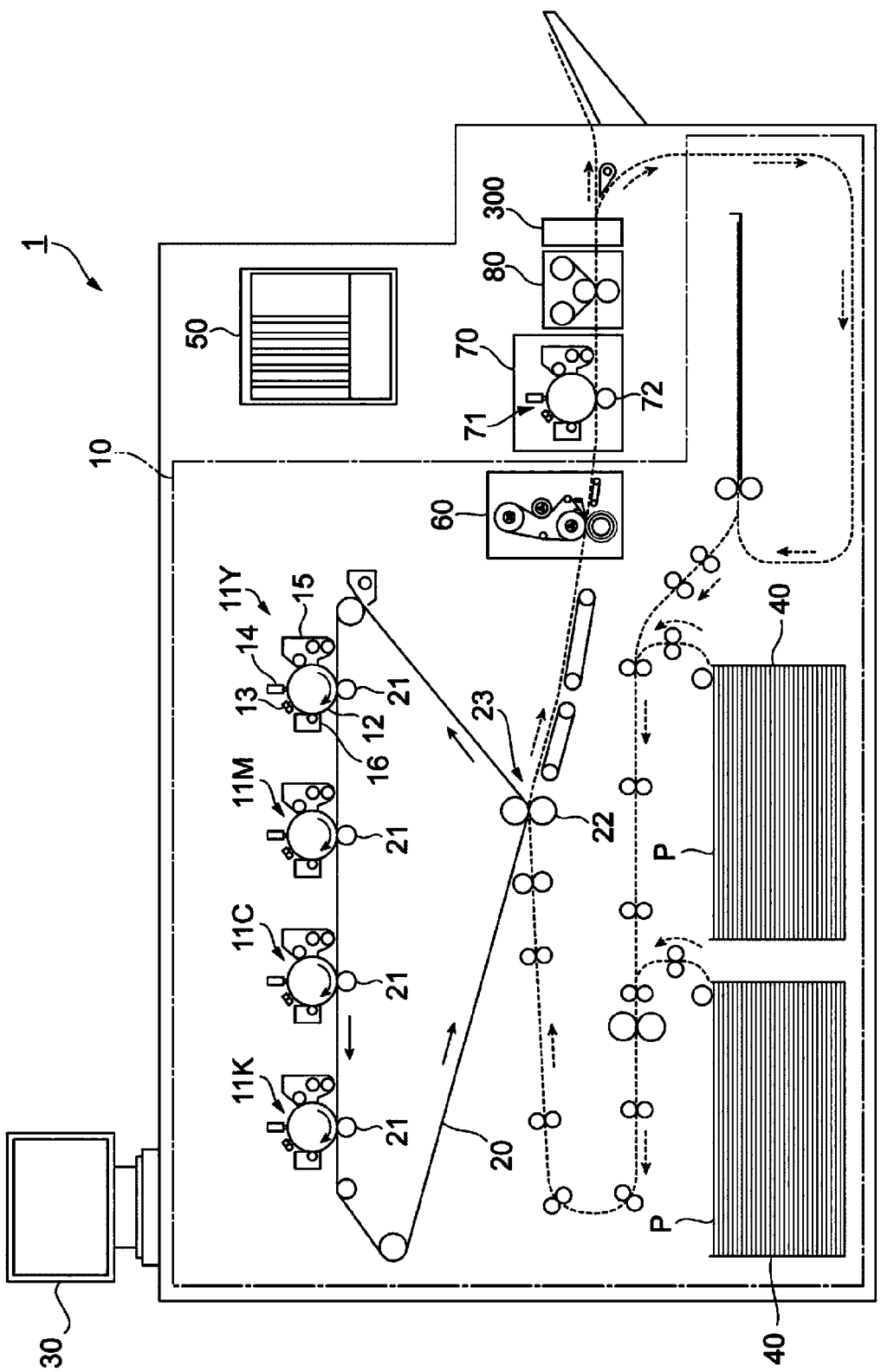
FIG. 1 schematically illustrates an example of a circuit board producing apparatus according to this exemplary embodiment.

Hereafter, an exemplary embodiment will be described. The following description and Examples are provided to illustrate the exemplary embodiment, and are not intended to limit the scope of the exemplary embodiment.

In the numerical range described in stages in this exemplary embodiment, the upper limit or the lower limit expressed in one numerical range may be replaced with that in other numerical ranges described in stages. In the numerical range described in this exemplary embodiment, the upper limit or the lower limit in the numerical range may be replaced with that described in Examples.

In this exemplary embodiment, each component may contain plural corresponding substances. In this exemplary embodiment, if plural substances that correspond to each component are contained in a composition, the amount of each component in the composition refers to the total amount of the plural substances in the composition unless otherwise specified.

In the present disclosure, the term "step" refers not only to an independent step, but also to a step that cannot be clearly distinguished from other steps but achieves an intended purpose of the step.

The method for producing a circuit board according to this exemplary embodiment includes a providing step of providing a substrate on which a toner image formed of a thermoplastic toner has been formed and a wire forming step of forming a conductive foil having a thickness of 0.1 µm or more and 2 µm or less on the toner image that has been formed on the substrate and then applying at least heat to the toner image and the conductive foil to form a wire made of the conductive foil. The method for producing a circuit board according to this exemplary embodiment may include other steps.

For the method for producing a circuit board and a circuit board producing apparatus that employs the method, there have been known methods that use a polymer film, an insulating substrate made of ceramic or the like, a metal foil, a photosensitive material (resist), and the like; and techniques in which a wiring circuit is printed by photolithography using a conductive ink. In the printing technique that employs photolithography in the related art, a photosensitive material is applied onto a substrate and then the substrate is exposed through a mask serving as an original plate of the wiring circuit to produce (print) a pattern of the wiring circuit on the substrate.

However, the method for producing a wiring circuit that uses a mask in the related art does not sufficiently have on-demand performance, that is, a circuit board with a desired pattern cannot be immediately produced in a desired amount. Furthermore, the production of a small number of circuit boards on a trial basis increases the cost.

In recent years, a method for producing a circuit board by forming a toner image formed of a thermoplastic toner on a substrate and pressing a conductive foil against the toner image has been developed as one of new printing techniques. In the printing technique that uses a thermoplastic toner in the related art, however, the wire of the finally produced circuit board may be partially chipped or short-circuited or the circuit board may generate heat (hereafter, occurrence of such phenomena is also referred to as "low resistance stability").

On the other hand, the method for producing a circuit board according to this exemplary embodiment may provide a circuit board including a wire having high resistance stability because the method includes the above steps. The cause is not clear, but may be considered to be as follows.

In the method for producing a circuit board according to this exemplary embodiment, the thickness of the conductive foil used in the wire forming step is 0.1 vim or more. That is, the thickness of a wire formed on the toner image increases, which tends to decrease the resistance of the wire. Therefore, it is believed that, for example, even when a large current is caused to pass through the wire, the generation of heat in the wire is suppressed.

In the method for producing a circuit board according to this exemplary embodiment, the thickness of the conductive foil used in the wire forming step is 2 µm or less. That is, the thickness of a wire formed on the toner image does not excessively increase, which tends to suppress the transfer failure of the conductive foil. As a result, the chipping and short-circuits of the wire are believed to be suppressed.

Hereafter, a circuit board producing apparatus according to this exemplary embodiment will be described in detail with reference to the attached drawings.

Circuit Board Producing Apparatus

A circuit board producing apparatus according to this exemplary embodiment includes a wire forming device that forms a conductive foil layer having a thickness of 0.1 µm or more and 2 µm or less on a toner image formed of a thermoplastic toner, the toner image being formed on a substrate, and that applies at least heat to the toner image and the conductive foil layer to form a wire made of conductive foil. The circuit board producing apparatus according to this exemplary embodiment may include other members.

FIG. 1 schematically illustrates an example of a circuit board producing apparatus according to this exemplary embodiment.

A circuit board producing apparatus 1 illustrated in FIG. 1 is a so-called tandem color printer. The circuit board producing apparatus 1 includes a guide image forming device 10 that forms a guide image on a paper sheet P which is an example of a substrate on the basis of image data, a controller 50 that controls the entire operation of the circuit board producing apparatus 1, communicates with a personal computer or the like, and performs image processing or the like on the image data, and a user interface unit 30 that receives input of an operation from a user and displays various information for the user. The circuit board producing apparatus 1 includes a toner image for conductive foil forming device 70 that forms a toner image for conductive foil on the paper sheet P using a thermoplastic toner for conductive foil according to this exemplary embodiment and a wire forming device 80 that forms a wire by forming a conductive foil layer having a thickness of 0.1 µm or more and 2 µm or less on the toner image for conductive foil and applying at least heat to the toner image for conductive foil and the conductive foil layer.

The circuit board producing apparatus 1 illustrated in FIG. 1 may be treated as an integrated circuit producing apparatus by further providing a device attachment 300 (attaching apparatus) used for attaching a semiconductor device.

The guide image forming device 10 is a functional device that forms an image through, for example, an electrophotographic process. The guide image forming device 10 includes four image forming units, namely, a yellow (Y) guide image forming unit 11Y, a magenta (M) guide image forming unit 11M, a cyan (C) guide image forming unit 11C, and a black (K) guide image forming unit 11K. In the following description, the four image forming units are collectively referred to as "guide image forming units 11" when the image forming units are described without differentiation.

Each of the guide image forming units 11 includes, for example, a photoconductor drum 12 on which an electrostatic latent image is formed and then a guide toner image of each color is formed, a charging unit 13 that charges a surface of the photoconductor drum 12 at a predetermined potential, an exposing unit 14 that exposes the photoconductor drum 12 charged by the charging unit 13 on the basis of the image data, a developing unit 15 that develops the electrostatic latent image formed on the photoconductor drum 12 using a toner of each color, and a cleaner 16 that cleans the surface of the photoconductor drum 12 after transfer. Each of the guide image forming units 11 has substantially the same configuration except for the toner contained in the developing unit 15.

The guide image forming device 10 includes a transfer belt 20 onto which the toner image of each color formed on the photoconductor drum 12 of each of the guide image forming units 11 is transferred and a first transfer roller 21 that transfers (first transfer) the guide toner image of each color formed in each of the guide image forming units 11 onto the transfer belt 20. The guide image forming device 10 also includes a second transfer roller 22 that transfers (second transfer), onto the paper sheet P, the toner images of all colors transferred onto the transfer belt 20 in a superimposed manner. The guide image forming device 10 also includes a fixing unit 60 that thermally fixing the guide toner images of all colors on the paper sheet P by heating and pressurizing the paper sheet P on which the guide toner images of all colors have been formed. In this exemplary embodiment, the toner for forming the toner image for conductive foil fixed on the paper sheet P by the thermal fixing treatment of the fixing unit 60 is referred to as a thermoplastic toner. The viscosity of the thermoplastic toner decreases through heating. In this exemplary embodiment, the region in which the second transfer roller 22 is disposed and the guide thermal fixing toner images of all colors on the transfer belt 20 are subjected to second transfer onto the paper sheet P is referred to as a second transfer region 23.

An example of the basic operation for producing a circuit board using the circuit board producing apparatus 1 will be described. The guide image forming units 11 of the guide image forming device 10 form the guide thermal fixing toner images of yellow, magenta, cyan, and black through an electrophotographic process that uses the above functional members. The guide thermal fixing toner images of all colors formed in the guide image forming units 11 are sequentially subjected to first transfer onto the transfer belt 20 by the first transfer roller 21 to form a combined toner image in which the guide thermal fixing toner images of all colors are superimposed. The combined toner image on the transfer belt 20 is transported to the second transfer region 23 in which the second transfer roller 22 is disposed with the movement (arrow direction) of the transfer belt 20.

A recording medium transport system transports a paper sheet P, which is fed from one of recording medium containers 40 by a feed roller, along a transport path to the second transfer region 23. In the second transfer region 23, the combined toner image on the transfer belt 20 is subjected to second transfer onto the paper sheet P all together by a transfer electric field generated by the second transfer roller 22.

Subsequently, the paper sheet P on which the image has been formed is separated from the transfer belt 20 and transported to the fixing unit 60 along the transport path. The image (guide thermal fixing toner image) on the paper sheet P that has been transported to the fixing unit 60 is fixed to the paper sheet P through a fixing treatment by the fixing unit 60.

The paper sheet P on which the guide thermal fixing toner image has been fixed by the fixing unit 60 is transported to a toner image for conductive foil forming device 70 along a transport path. A toner image for conductive foil constructed from a thermoplastic toner is formed on the paper sheet P that has been transported to the toner image for conductive foil forming device 70. Then, conductive foil having a thickness of 0.1 µm or more and 2 µm or less is pressed against and bonded to the formed toner image for conductive foil constructed from the thermoplastic toner by a wire forming device 80. At least heat is applied to the toner image for conductive foil and the conductive foil to bond a wire made of conductive foil on the toner image for conductive foil. Thus, a circuit board is produced.

The toner image for conductive foil forming device 70 includes a toner image for conductive foil forming unit 71 that is a functional unit which forms a toner image for conductive foil through an electrophotographic process. The toner image for conductive foil forming unit 71 has substantially the same configuration as each of the guide image forming units 11 of the guide image forming device 10, except that toner is accommodated. The toner image for conductive foil forming device 70 also includes a toner image transfer roller 72 that transfers, onto the paper sheet P, the toner image for conductive foil that has been formed on the toner image for conductive foil forming unit 71.

Hereafter, each material used in the circuit board producing apparatus according to this exemplary embodiment will be described in detail. The description will be made without using reference numerals.

Thermoplastic Toner

The thermoplastic toner will be described.

The thermoplastic toner (hereafter also simply referred to as a "toner") according to this exemplary embodiment contains toner particles and an optional external additive.

Properties of Thermoplastic Toner

The upper limit of the flow-start temperature of the thermoplastic toner under heating is preferably 80° C. or lower, more preferably 78° C. or lower, and further preferably 75° C. or lower from the viewpoint of formation of wires having high resistance stability.

The lower limit of the flow-start temperature of the thermoplastic toner under heating is preferably 50° C. or higher, more preferably 55° C. or higher, and further preferably 60° C. or higher from the viewpoint of storage, that is, suppression of a phenomenon in which toner fuses by heat (blocking).

The upper limit of the half-fall temperature of the thermoplastic toner under heating is preferably 95° C. or lower, more preferably 90° C. or lower, and further preferably 86° C. or lower from the viewpoint of formation of wires having high resistance stability.

The lower limit of the half-fall temperature of the thermoplastic toner under heating is preferably 60° C. or higher, more preferably 65° C. or higher, and further preferably 70° C. or higher from the viewpoint of suppression of the generation of aggregate coarse powder.

The "flow-start temperature" refers to a "flowout-start temperature" described in a polymer material testing method ("Polymer Engineering" 14, pp. 364 to 369, edited by The Society of Polymer Science, Japan, CHIJIN SHOKAN Co., Ltd., 1963).

The flow-start temperature and the half-fall temperature of the thermoplastic toner under heating are determined with a Koka-type flow tester CFT-500 (manufactured by SHIMADZU Corporation). Specifically, a thermoplastic toner is compressed and solidified to prepare a pellet test specimen. Then, the pellet in a cylinder is heated at a heating rate of 1° C./min from 50° C. using a die having a cavity diameter of 0.5 mm, a piston area of 1 $cm^2$, a die length of 1 mm, and a compression load of 10 $kgf/cm^2$. The temperature at which the specimen being pressed by the piston starts to melt and flow out is defined as a flowout-start temperature. The middle temperature between the flowout-start temperature and a flowout-end temperature at which all the specimen being pressed by the piston melts and flows out is defined as a half-fall temperature.

The method for setting the flow-start temperature and the half-fall temperature of the thermoplastic toner under heating within the above ranges is not particularly limited. Examples of the method include the control of the content of an amorphous resin contained in a coating layer, the control of the ratio of an amorphous resin and a crystalline resin, and the control of the glass transition temperature of an amorphous resin in the below-described method that uses toner particles having a core-shell structure including a core (core particle) and a coating layer (shell layer) that coats the core.

The thermoplastic toner may contain an amorphous resin and a crystalline resin from the viewpoint of formation of wires having higher resistance stability.

The thermoplastic toner may contain toner particles having a structure including a core that contains an amorphous resin and a crystalline resin and a coating portion that coats the core and contains an amorphous resin from the viewpoint of formation of wires having higher resistance stability.

The thermoplastic toner may be a colored thermoplastic toner containing a coloring agent or a transparent thermoplastic toner. The thermoplastic toner is preferably a transparent thermoplastic toner from the viewpoint of, for example, suppressing the visibility of the color of the toner image below the conductive foil serving as a wire after the formation of a circuit board and reducing the cost in the production process.

Herein, the "transparent thermoplastic toner" refers to a thermoplastic toner that transmits at least visible light. The transparent thermoplastic toner substantially does not contain a coloring agent. The phrase "substantially does not contain" means that the coloration is not visually observed.

Toner Particle

The toner particles contain, for example, a binder resin and optionally a coloring agent, a release agent, and other additives.

Characteristics of Toner Particles

The toner particles may be toner particles having a single-layer structure or toner particles having a so-called core-shell structure including a core (core particle) and a coating layer (shell layer) that coats the core.

Herein, the toner particles having a core-shell structure may each be constituted by, for example, a core containing a binder resin and other optional additives such as a coloring agent and a release agent and a coating layer containing a binder resin. When the toner particles having a core-shell structure are produced by a dissolution suspension process, the coating layer may be a coating layer containing inorganic particles. The release agent may be contained in at least one of the core and the coating layer.

When the toner particles having a core-shell structure are used, the aggregation of toner during the production, storage, and the like of toner tends to be suppressed. As a result, adhesive failure due to partial separation of a toner image also tends to be suppressed while the adhesiveness of the conductive foil at low temperature provided by the thermoplastic toner is maintained.

When the toner particles have a core-shell structure, the lower limit of the content of the crystalline resin in the core particle is preferably 15 mass % or more, more preferably 20 mass % or more, and further preferably 25 mass % or more relative to the total amount of the binder resin contained in the core particle.

When the toner particles have a core-shell structure, the upper limit of the content of the crystalline resin in the core particle may be 50 mass % or less relative to the total amount of the binder resin contained in the core particle from the viewpoint of sufficient chargeability as a thermoplastic toner and storage stability.

The volume-average particle diameter (D50v) of the toner particles is preferably 2 μm or more and 10 μm or less and more preferably 4 μm or more and 8 μm or less.

The average particle diameter of the toner particles is measured with a COULTER MULTISIZER II (manufactured by Beckman Coulter, Inc.) using ISOTON-II (manufactured by Beckman Coulter, Inc.) as an electrolyte.

For measurement, 0.5 mg or more and 50 mg or less of a test sample is added to 2 mL of a 5% aqueous solution of a surfactant (e.g., sodium alkylbenzenesulfonate) serving as a dispersant. The mixture is added to 100 ml or more and 150 ml or less of the electrolyte.

The sample suspended in the electrolyte is dispersed using an ultrasonic disperser for one minute. The particle size distribution of particles having a particle diameter of 2 μm or more and 60 μm or less is measured with a COULTER MULTISIZER II using an aperture having an aperture size of 100 μm. The number of particles subjected to sampling is 50000.

The measured particle size distribution is divided into particle size sections (channels). The cumulative volume is drawn from smaller particle diameters. The particle diameter at which the cumulative volume is 50% is defined as a volume-average particle diameter D50v.

For the toner particles, the volume ratio of toner particles having a particle diameter of 16 μm or more is preferably 1% or less, more preferably 0.7% or less, and further preferably 0.5% or less relative to the total volume of the toner particles.

When the volume ratio of toner particles having a particle diameter of 16 μm or more is 1% or less relative to the total volume of the toner particles, the variation in the width of toner images linearly formed on a substrate tends to be suppressed. Therefore, the variation in the widths of conductive foil formed on the toner images also tends to be suppressed. As a result, it is believed that, for example, even when plural wires are arranged with small intervals (e.g., intervals of 1 mm), the generation of short-circuits between adjacent wires is easily suppressed.

In addition, for example, when a wire is formed by pressing conductive foil against the toner image formed on the substrate, high uniformity of the particle size distribution of the toner particles is easily achieved and the uniformity of pressure at which the conductive foil is pressed against the toner image tends to increase. As a result, it is believed that the uneven formation of the conductive foil on the toner image is suppressed and thus the breaking of the formed wire is easily suppressed.

The volume ratio of toner particles having a particle diameter of 16 μm or more is determined as follows.

In the measurement of the particle diameter of the toner particles, a histogram is made by dividing the measured particle size distribution into volume particle size intervals. The volume ratio (cumulative relative frequency) of toner particles having a particle diameter of 16 μm or more relative to the total volume of the toner particles is determined from the histogram.

The method for setting the volume ratio of toner particles having a particle diameter of 16 μm or more to 1% or less relative to the total volume of the toner particles is not particularly limited. For example, when the toner is produced by an aggregation-coalescence process, the method is performed by, for example, adjusting the amount of a coagulant or increasing the uniformity of stirring in an aggregated-particle forming step. When the toner is produced by a dissolution suspension process, the method is performed by, for example, adjusting the amount of inorganic particles in an oil-phase dispersion step or adjusting the solid content in an oil phase. When the toner is produced by a kneading-pulverizing process, the method is performed by, for example, adjustment with air classification.

The average circularity of the toner particles is preferably 0.94 or more and 1.00 or less and more preferably 0.95 or more and 0.98 or less.

The average circularity of the toner particles is determined by (circle-equivalent perimeter)/(perimeter) (i.e., (perimeter of circle with projected area equal to that of particle image)/(perimeter of projected particle image)). Specifically, the average circularity is measured by the following method.

The toner particles to be measured are first sampled by suction to form a flat flow. Particle images are captured as still images by causing a strobe light to flash. The particle images are analyzed with a flow particle image analyzer (FPIA-3000 manufactured by Sysmex Corporation). The number of particles sampled to determine the average circularity is 3500.

If the toner contains an external additive, the toner (developer) to be measured is dispersed in water containing a surfactant and then sonicated to obtain toner particles from which the external additive has been removed.

Binder Resin

The binder resin is an amorphous resin.

Examples of the amorphous resin include publicly known amorphous resins such as amorphous polyester resins, amorphous vinyl resins (e.g., styrene-acrylic resins), epoxy resins, polycarbonate resins, and polyurethane resins. Among them, amorphous polyester resins and amorphous vinyl resins (in particular, styrene-acrylic resins) are preferably used and amorphous polyester resins are more preferably used from the viewpoint of fixability and chargeability of toner.

The amorphous resin refers to a resin that has no clear endothermic peak, but only step-wise endothermic changes in thermal analysis by differential scanning calorimetry (DSC), is solid at room temperature, and has thermoplasticity at a temperature equal to or higher than the glass transition temperature.

In contrast, the crystalline resin refers to a resin that has a clear endothermic peak instead of step-wise endothermic changes in differential scanning calorimetry (DSC).

Specifically, for example, the crystalline resin refers to a resin that has an endothermic peak half-width of 10° C. or lower when measured at a heating rate of 10° C./min. The amorphous resin refers to a resin that has a half-width of more than 10° C. or a resin that has no clear endothermic peak.

Examples of the amorphous polyester resin include polycondensation products between polyvalent carboxylic acids and polyhydric alcohols. The amorphous polyester resin may be a commercially available product or may be synthesized and used.

Examples of the polyvalent carboxylic acid include aliphatic dicarboxylic acids (e.g., oxalic acid, malonic acid, maleic acid, fumaric acid, citraconic acid, itaconic acid, glutaconic acid, succinic acid, alkenylsuccinic acid, adipic acid, and sebacic acid), alicyclic dicarboxylic acids (e.g., cyclohexanedicarboxylic acid), aromatic dicarboxylic acids (e.g., terephthalic acid, isophthalic acid, phthalic acid, and naphthalenedicarboxylic acid), anhydrides thereof, and lower (e.g., with 1 to 5 carbon atoms) alkyl esters. Among them, the polyvalent carboxylic acid is preferably, for example, an aromatic dicarboxylic acid.

For the polyvalent carboxylic acids, a trivalent or higher carboxylic acid that has a crosslinked structure or a branched structure may be used in combination with a dicarboxylic acid. Examples of the trivalent or higher carboxylic acid include trimellitic acid, pyromellitic acid, anhydrides thereof, and lower (e.g., with 1 to 5 carbon atoms) alkyl esters thereof.

The polyvalent carboxylic acids may be used alone or in combination of two or more.

Examples of the polyhydric alcohol include aliphatic diols (e.g., ethylene glycol, diethylene glycol, triethylene glycol, propylene glycol, butanediol, hexanediol, and neopentyl glycol), alicyclic diols (e.g., cyclohexanediol, cyclohexanedimethanol, and hydrogenated bisphenol A), and aromatic diols (e.g., an ethylene oxide adduct of bisphenol A and a propylene oxide adduct of bisphenol A). Among them, aromatic diols and alicyclic diols are preferably used and aromatic diols are more preferably used as the polyhydric alcohol.

For the polyhydric alcohols, a trihydric or higher alcohol that has a crosslinked structure or a branched structure may be used in combination with a diol. Examples of the trihydric or higher alcohol include glycerol, trimethylolpropane, and pentaerythritol.

The polyhydric alcohols may be used alone or in combination of two or more.

However, no or very little, if any, alkylene oxide adduct of bisphenol A (an ethylene oxide adduct of bisphenol A, a propylene oxide adduct of bisphenol A, an ethylene oxide/propylene oxide adduct of bisphenol A, or the like) is used as the polyhydric alcohol. Specifically, when an alkylene oxide adduct of bisphenol A is used, the amount thereof may be more than 0 mol % but not more than 5 mol % relative to the total amount of the polyhydric alcohols.

The glass transition temperature (Tg) of the amorphous polyester resin is preferably 50° C. or higher and 65° C. or lower, more preferably 55° C. or higher and 64° C. or lower, and further preferably 58° C. or higher and 62° C. or lower.

The glass transition temperature of the amorphous polyester resin is determined from a DSC curve obtained by differential scanning calorimetry (DSC). More specifically, the glass transition temperature is determined by the method described in "Extrapolated glass transition start temperature", which is one method for determining the glass transition temperature in JIS K7121-1987 "Testing Methods for Transition Temperatures of Plastics".

The weight-average molecular weight (Mw) of the amorphous polyester resin is preferably 5000 or more and 1000000 or less, more preferably 7000 or more and 500000 or less, and further preferably 30000 or more and 50000 or less.

The number-average molecular weight (Mn) of the amorphous polyester resin may be 2000 or more and 100000 or less.

The molecular weight distribution Mw/Mn of the amorphous polyester resin is preferably 1.5 or more and 100 or less and more preferably 2 or more and 60 or less.

The weight-average molecular weight and the number-average molecular weight of the amorphous polyester resin are measured by gel permeation chromatography (GPC). The molecular weight measurement by GPC is conducted with a GPC·HLC-8120GPC manufactured by TOSOH Corporation as a measuring instrument using columns, TSKgel Super HM-M (15 cm) manufactured by TOSOH Corporation, and a THF solvent. The weight-average molecular weight and the number-average molecular weight are calculated from the measurement results by using the molecular weight calibration curves obtained from monodisperse polystyrene standard samples.

The amorphous polyester resin is obtained by a well-known production method. Specifically, for example, the amorphous polyester resin is obtained by setting the polymerization temperature to 180° C. or higher and 230° C. or lower, decreasing the pressure in the reaction system as necessary, and causing a reaction while removing water and alcohol generated during condensation.

When the monomers serving as raw materials do not dissolve or are not compatible with each other at a reaction temperature, a solvent having a high boiling point may be added as a dissolution aid to dissolve the monomers. In this case, the polycondensation reaction is caused while the dissolution aid is distilled away. When monomers poorly compatible with each other are present, the poorly compatible monomer and an acid or alcohol to be subjected to polycondensation with that monomer may be preliminarily condensed, and then the resulting product may be subjected to polycondensation with the principal component.

The content of the amorphous polyester resin is preferably 60 mass % or more and 98 mass % or less, more preferably 70 mass % or more and 98 mass % or less, and further preferably 80 mass % or more and 98 mass % or less relative to the total amount of the binder resin.

Herein, a crystalline resin may be used in combination with the amorphous resin.

Examples of the crystalline resin include publicly known crystalline resins such as crystalline polyester resins and crystalline vinyl resins (e.g., polyalkylene resins and long-chain alkyl (meth)acrylate resins). Among them, crystalline polyester resins are preferably used from the viewpoint of easily controlling the flow-start temperature and the half-fall temperature of the thermoplastic toner under heating within the above ranges.

An example of the crystalline polyester resin is a polycondensation product of a polyvalent carboxylic acid and a polyhydric alcohol. The crystalline polyester resin may be a commercially available product or may be synthesized and used.

Herein, in order to easily form the crystal structure, the crystalline polyester resin may be a polycondensation product prepared by using a polymerizable monomer having a straight-chain aliphatic structure rather than a polymerizable monomer having an aromatic structure.

Examples of the polyvalent carboxylic acids include aliphatic dicarboxylic acids (e.g., oxalic acid, succinic acid, glutaric acid, adipic acid, suberic acid, azelaic acid, sebacic acid, 1,9-nonanedicarboxylic acid, 1,10-decanedicarboxylic acid, 1,12-dodecanedicarboxylic acid, 1,14-tetradecanedicarboxylic acid, and 1,18-octadecanedicarboxylic acid), aromatic dicarboxylic acids (e.g., dibasic acids such as phthalic acid, isophthalic acid, terephthalic acid, and naphthalene-2,6-dicarboxylic acid), anhydrides thereof, and lower (e.g., with 1 to 5 carbon atoms) alkyl esters thereof.

For the polyvalent carboxylic acids, a trivalent or higher carboxylic acid that has a crosslinked structure or a branched structure may be used in combination with a dicarboxylic acid. Examples of the trivalent carboxylic acids include aromatic carboxylic acids (e.g., 1,2,3-benzenetricarboxylic acid, 1,2,4-benzenetricarboxylic acid, and 1,2,4-naphthalenetricarboxylic acid), anhydrides thereof, and lower (e.g., with 1 to 5 carbon atoms) alkyl esters thereof.

For the polyvalent carboxylic acids, a dicarboxylic acid having a sulfonic acid group or a dicarboxylic acid having an ethylenic double bond may be used in combination with these dicarboxylic acids.

The polyvalent carboxylic acids may be used alone or in combination of two or more.

Examples of the polyhydric alcohols include aliphatic diols (e.g., straight-chain aliphatic diols having a main chain containing 7 to 20 carbon atoms). Examples of the aliphatic diols include ethylene glycol, 1,3-propanediol, 1,4-butanediol, 1,5-pentanediol, 1,6-hexanediol, 1,7-heptanediol, 1,8-octanediol, 1,9-nonanediol, 1,10-decanediol, 1,11-undecanediol, 1,12-dodecanediol, 1,13-tridecanediol, 1,14-tetradecanediol, 1,18-octadecanediol, and 1,14-eicosadecanediol. Among them, 1,8-octanediol, 1,9-nonanediol, and 1,10-decanediol are preferably used as aliphatic diols.

For the polyhydric alcohols, a trihydric or higher alcohol that has a crosslinked structure or a branched structure may be used in combination with a diol. Examples of the trihydric or higher alcohols include glycerol, trimethylolethane, trimethylolpropane, and pentaerythritol.

The polyhydric alcohols may be used alone or in combination of two or more.

The content of the aliphatic diol in the polyhydric alcohol may be 80 mol % or more and is preferably 90 mol % or more.

For the combination of the amorphous resin and the crystalline resin, an amorphous polyester resin and a crystalline polyester resin may be combined with each other.

In the case where the binder resin contains an amorphous polyester resin and a crystalline polyester resin, for example, when the toner particles have a core-shell structure, the compatibility between sites of the crystalline resin and the amorphous resin and the melting point tend to be easily controlled. As a result, the thermoplastic toner has a characteristic (sharp-melting characteristic) of melting with a viscosity decrease in a narrow temperature range, which tends to improve the adhesiveness of the conductive foil at low temperature provided by the thermoplastic toner.

The melting temperature of the crystalline polyester resin is preferably 50° C. or higher and 95° C. or lower, more preferably 55° C. or higher and 90° C. or lower, and further preferably 60° C. or higher and 85° C. or lower.

The melting temperature of the crystalline polyester resin is determined from the DSC curve obtained by differential scanning calorimetry (DSC) by the method described in "Melting peak temperature", which is one method for determining the melting temperature in JIS K7121-1987 "Testing Methods for Transition Temperatures of Plastics".

The lower limit of the glass transition temperature of the amorphous resin is preferably 50° C. or higher, more preferably 55° C. or higher, and further preferably 58° C. or higher from the viewpoint of heat resistance and storage.

The upper limit of the glass transition temperature of the amorphous resin is preferably 65° C. or lower, more preferably 64° C. or lower, and further preferably 62° C. or lower from the viewpoint of decreasing the flow-start temperature to a temperature lower than that of typical thermoplastic toners so that the wire made of conductive foil and the fixed image formed of toner coexist.

The glass transition temperature of the amorphous resin is determined in the same manner as the glass transition temperature of the amorphous polyester resin.

The melting temperature of the crystalline resin is preferably 50° C. or higher and 95° C. or lower, more preferably 55° C. or higher and 90° C. or lower, and further preferably 60° C. or higher and 85° C. or lower.

The melting temperature of the crystalline resin is determined in the same manner as the melting temperature of the crystalline polyester resin.

In general, when such a thermoplastic toner that exhibits the above melting behavior is used, a phenomenon (hereafter referred to as "offset") in which a toner image adheres to a fixing member or the like in an apparatus may occur. In the method for producing a circuit board according to this exemplary embodiment, however, it is believed that the occurrence of the offset is suppressed by the presence of the conductive foil layer.

The weight-average molecular weight (Mw) of the crystalline polyester resin is preferably 6,000 or more and 35,000 or less.

The crystalline polyester resin is obtained by a well-known production method as in the case of, for example, the amorphous polyester.

The content of the crystalline resin (e.g., crystalline polyester resin) is preferably 3 mass % or more and 20 mass % or less and more preferably 5 mass % or more and 15 mass % or less relative to the total amount of the thermoplastic toner.

For the binder resin, a binder resin other than the amorphous polyester resin and the crystalline resin may be used in combination. Herein, the content of the other binder resin may be 10 mass % or less relative to the total amount of the binder resin.

The content of the binder resin is, for example, preferably 40 mass % or more and 95 mass % or less, more preferably 50 mass % or more and 90 mass % or less, and further preferably 60 mass % or more and 85 mass % or less relative to the total amount of the toner particles.

Coloring Agent

Examples of the coloring agent include pigments such as carbon black, chrome yellow, hansa yellow, benzidine yellow, threne yellow, quinoline yellow, pigment yellow, permanent orange GTR, pyrazolone orange, vulcan orange, watchung red, permanent red, brilliant carmine 3B, brilliant carmine 6B, dupont oil red, pyrazolone red, lithol red, rhodamine B lake, lake red C, pigment red, rose bengal, aniline blue, ultramarine blue, calco oil blue, methylene blue chloride, phthalocyanine blue, pigment blue, phthalocyanine green, and malachite green oxalate; and dyes such as acridine dyes, xanthene dyes, azo dyes, benzoquinone dyes, azine dyes, anthraquinone dyes, thioindigo dyes, dioxazine dyes, thiazine dyes, azomethine dyes, indigo dyes, phthalocyanine dyes, aniline black dyes, polymethine dyes, triphenylmethane dyes, diphenylmethane dyes, and thiazole dyes.

The coloring agents may be used alone or in combination of two or more.

The coloring agent may be a surface-treated coloring agent or may be used together with a dispersant, if necessary. Plural coloring agents may be used in combination.

The content of the coloring agent is, for example, preferably 1 mass % or more and 30 mass % or less and more preferably 3 mass % or more and 15 mass % or less relative to the total amount of the toner particles.

Release Agent

Examples of the release agent include, but are not limited to, hydrocarbon waxes; natural waxes such as carnauba wax, rice wax, and candelilla wax; synthetic or mineral/petroleum waxes such as montan wax; and ester waxes such as fatty acid esters and montanic acid esters.

The melting temperature of the release agent is preferably 50° C. or higher and 110° C. or lower and more preferably 60° C. or higher and 100° C. or lower.

The melting temperature is determined from the DSC curve obtained by differential scanning calorimetry (DSC) by the method described in "Melting peak temperature", which is one method for determining the melting temperature in JIS K7121-1987 "Testing Methods for Transition Temperatures of Plastics".

The content of the release agent is, for example, preferably 1 mass % or more and 20 mass % or less and more preferably 5 mass % or more and 15 mass % or less relative to the total amount of the toner particles.

Other Additives

Examples of other additives include well-known additives such as magnetic materials, charge control agents, and inorganic powder. These additives are contained in the toner particles as internal additives.

External Additive

Examples of the external additives include inorganic particles. Examples of the inorganic particles include $SiO_2$, $TiO_2$, $Al_2O_3$, $CuO$, $ZnO$, $SnO_2$, $CeO_2$, $Fe_2O_3$, $MgO$, $BaO$, $CaO$, $K_2O$, $Na_2O$, $ZrO_2$, $CaO.SiO_2$, $K_2O.(TiO_2)_n$, $Al_2O_3.2SiO_2$, $CaCO_3$, $MgCO_3$, $BaSO_4$, and $MgSO_4$.

The surface of the inorganic particles serving as an external additive may be hydrophobized. The hydrophobizing treatment is performed by, for example, immersing the inorganic particles in a hydrophobizing agent. Examples of the hydrophobizing agent include, but are not limited to, a silane coupling agent, silicone oil, a titanate coupling agent, and an aluminum coupling agent. These hydrophobizing agents may be used alone or in combination of two or more.

The amount of the hydrophobizing agent is normally, for example, 1 part by mass or more and 10 parts by mass or less relative to 100 parts by mass of the inorganic particles.

Examples of the external additives include resin particles (resin particles of, for example, polystyrene, polymethyl methacrylate (PMMA), and melamine resin) and cleaning active agents (e.g., particles of higher fatty acid metal salts such as zinc stearate, and fluoropolymer particles).

The amount of the external additive added is, for example, preferably 0.01 mass % or more and 5 mass % or less and more preferably 0.01 mass % or more and 2.0 mass % or less relative to the amount of the toner particles.

Method for Producing Toner

Next, a method for producing a toner according to this exemplary embodiment will be described.

The toner according to this exemplary embodiment is obtained by producing toner particles and then adding an external additive to the toner particles.

The toner particles may be produced by either a dry process (e.g., kneading-pulverizing process) or a wet process (e.g., aggregation-coalescence process, suspension polymerization process, and dissolution suspension process). The process for producing toner particles is not particularly limited to the above processes, and a well-known process may be employed.

In particular, the toner particles may be produced by an aggregation-coalescence process.

Specifically, for example, the toner particles are produced by an aggregation-coalescence process as follows.

The toner particles are produced through a step (resin particle dispersion liquid providing step) of providing a resin particle dispersion liquid in which resin particles serving as a binder resin are dispersed, a step (aggregated-particle forming step) of aggregating the resin particles (and optionally other particles) in the resin particle dispersion liquid (if necessary, in a dispersion liquid prepared by mixing other particle dispersion liquids) to form aggregated particles, and a step (coalescing step) of heating an aggregated particle dispersion liquid in which the aggregated particles are dispersed to coalesce the aggregated particles, thereby forming toner particles.

When the toner particles are produced by a dissolution suspension process, the toner particles having a core-shell structure may be produced through an oil-phase dispersion step of dispersing inorganic particles serving as a shell layer in an oil phase.

When the toner particles are produced by a kneading-pulverizing process, the toner particles may be produced through a step of classifying a pulverized product by air classification.

Hereafter, each of the steps in the aggregation-coalescence process will be described in detail.

Although the method for producing toner particles containing a coloring agent and a release agent will be described below, the coloring agent and the release agent are optional additives. Obviously, additives other than the coloring agent and the release agent may be used.

Resin Particle Dispersion Liquid Providing Step

There are provided a resin particle dispersion liquid in which resin particles serving as a binder resin are dispersed and, for example, a coloring agent particle dispersion liquid in which coloring agent particles are dispersed and a release agent particle dispersion liquid in which release agent particles are dispersed.

Herein, the resin particle dispersion liquid is prepared by, for example, dispersing resin particles in a dispersion medium using a surfactant.

The dispersion medium used for the resin particle dispersion liquid is, for example, an aqueous medium.

Examples of the aqueous medium include water, such as distilled water and ion-exchanged water, and alcohols. These aqueous media may be used alone or in combination of two or more.

Examples of the surfactant include anionic surfactants such as sulfates, sulfonates, phosphates, and soaps; cationic surfactants such as amine salts and quaternary ammonium salts; and nonionic surfactants such as polyethylene glycol, alkylphenol-ethylene oxide adducts, and polyhydric alcohols. In particular, anionic surfactants and cationic surfactants are used. Nonionic surfactants may be used in combination with anionic surfactants or cationic surfactants.

These surfactants may be used alone or in combination of two or more.

In the resin particle dispersion liquid, the resin particles are dispersed in the dispersion medium by, for example, common dispersion processes that use a rotary shear homogenizer or a ball mill, a sand mill, or a Dyno-Mill including media. Alternatively, the resin particles may be dispersed in the resin particle dispersion liquid by, for example, a phase-inversion emulsification process depending on the types of resin particles.

In the phase-inversion emulsification process, a resin to be dispersed is dissolved in a hydrophobic organic solvent in which the resin is soluble. After the organic continuous phase (O-phase) is neutralized with a base, an aqueous medium (W-phase) is added to cause resin conversion (i.e., phase inversion) from water-in-oil (W/O) to oil-in-water (O/W), thereby forming a discontinuous phase. Thus, the resin is dispersed in the aqueous medium in the form of particles.

The volume-average particle diameter of the resin particles dispersed in the resin particle dispersion liquid is, for example, preferably 0.01 μm or more and 1 μm or less, more preferably 0.08 μm or more and 0.8 μm or less, and further preferably 0.1 μm or more and 0.6 μm or less.

The volume-average particle diameter of the resin particles is determined as follows. A particle size distribution is obtained using a laser diffraction particle size analyzer (e.g., LA-700 manufactured by Horiba, Ltd.) and is divided into particle size sections (channels). A cumulative volume distribution is drawn from smaller particle sizes. The volume-average particle diameter D50v is determined as a particle diameter at which the cumulative volume is 50% of all particles. The volume-average particle diameters of particles dispersed in other dispersion liquids are also determined in the same manner.

The content of the resin particles in the resin particle dispersion liquid is, for example, preferably 5 mass % or more and 50 mass % or less and more preferably 10 mass % or more and 40 mass % or less.

For example, the coloring agent particle dispersion liquid and the release agent particle dispersion liquid are also prepared in the same manner as the resin particle dispersion liquid. That is, the volume-average particle diameter, the dispersion medium, the dispersion process, and the content of coloring agent particles dispersed in the coloring agent particle dispersion liquid and release agent particles dispersed in the release agent particle dispersion liquid are similar to those of the particles in the resin particle dispersion liquid.

Aggregated-Particle Forming Step

Subsequently, the resin particle dispersion liquid, the coloring agent particle dispersion liquid, and the release agent particle dispersion liquid are mixed with each other.

The resin particles, the coloring agent particles, and the release agent particles are subjected to heteroaggregation in the mixed dispersion liquid to form aggregated particles including the resin particles, the coloring agent particles, and the release agent particles and having a particle diameter close to that of the toner particles.

Specifically, the aggregated particles are formed by, for example, adding a coagulant to the mixed dispersion liquid, adjusting the pH of the mixed dispersion liquid to an acidic pH (e.g., a pH of 2 to 5), optionally adding a dispersion stabilizer, and then heating the mixed dispersion liquid to aggregate the particles dispersed therein. Herein, the mixed dispersion liquid is heated to the glass transition temperature of the resin particles (e.g., glass transition temperature of resin particles—30° C. to glass transition temperature of resin particles—10° C.)

The aggregated-particle forming step may be performed by, for example, adding the coagulant to the mixed dispersion liquid at room temperature (e.g., 25° C.) under stirring with a rotary shear homogenizer, adjusting the pH of the mixed dispersion liquid to an acidic pH (e.g., a pH of 2 to 5), optionally adding a dispersion stabilizer, and then performing the above heating.

Examples of the coagulant include surfactants having a polarity opposite to that of the surfactant used as a dispersant added to the mixed dispersion liquid, inorganic metal salts, and metal complexes with a valence of two or more. In particular, when a metal complex is used as the coagulant, the amount of surfactant used is reduced and thus the charging characteristics are improved.

An additive that forms a complex or a similar linkage with metal ions of the coagulant may be optionally used. An example of this additive is a chelating agent.

Examples of the inorganic metal salts include metal salts such as calcium chloride, calcium nitrate, barium chloride, magnesium chloride, zinc chloride, aluminum chloride, and aluminum sulfate; and inorganic metal salt polymers such as polyaluminum chloride, polyaluminum hydroxide, and calcium polysulfide.

The chelating agent may be a water-soluble chelating agent. Examples of the chelating agent include oxycarboxylic acids such as tartaric acid, citric acid, and gluconic acid; iminodiacetic acid (IDA); nitrilotriacetic acid (NTA); and ethylenediaminetetraacetic acid (EDTA).

The amount of the chelating agent added is, for example, preferably 0.01 parts by mass or more and 5.0 parts by mass or less and more preferably 0.1 parts by mass or more and less than 3.0 parts by mass relative to 100 parts by mass of the resin particles.

Coalescing Step

Subsequently, the aggregated particle dispersion liquid in which the aggregated particles are dispersed is heated to, for example, a temperature higher than or equal to the glass transition temperature of the resin particles (e.g., 10° C. to 30° C. higher than the glass transition temperature of the resin particles) to coalesce the aggregated particles, thereby forming toner particles.

Through the above steps, toner particles are produced.

Alternatively, the toner particles may be produced through a step of, after the aggregated particle dispersion liquid in which the aggregated particles are dispersed is obtained, mixing the aggregated particle dispersion liquid with a resin particle dispersion liquid in which the resin particles are dispersed and further causing the resin particles to adhere to the surfaces of the aggregated particles to form second aggregated particles; and a step of heating a second aggregated particle dispersion liquid in which the second aggregated particles are dispersed to coalesce the second aggregated particles, thereby forming toner particles having a core-shell structure.

Upon completion of the coalescing step, the toner particles formed in the solution are subjected to publicly known washing, solid-liquid separating, and drying steps to obtain dry toner particles.

In the washing step, the toner particles may be sufficiently subjected to displacement washing with ion-exchanged water from the viewpoint of chargeability. The solid-liquid separating step is not particularly limited, and a process such as suction filtration or pressure filtration may be employed from the viewpoint of productivity. The drying step is also not particularly limited, and a process such as freeze drying, flush jet drying, fluidized bed drying, or vibrating fluidized bed drying may be employed from the viewpoint of productivity.

The toner according to this exemplary embodiment is produced by, for example, mixing the resulting dry toner particles with an external additive. The mixing may be performed using, for example, a machine such as a V-blender, a HENSCHEL MIXER, or a Loedige mixer. Optionally, coarse toner particles may be removed using a machine such as a vibrating screen or an air screen.

Conductive Foil

The conductive foil will be described.

The lower limit of the thickness of the conductive foil is 0.1 µm or more, preferably 0.2 µm or more, and more preferably 0.3 µm or more from the viewpoint of formation of wires having high resistance stability.

The upper limit of the thickness of the conductive foil is 2 µm or less, preferably 1.5 µm or less, and more preferably 1.0 µm or less from the viewpoint of formation of wires having high resistance stability.

Figure 2:
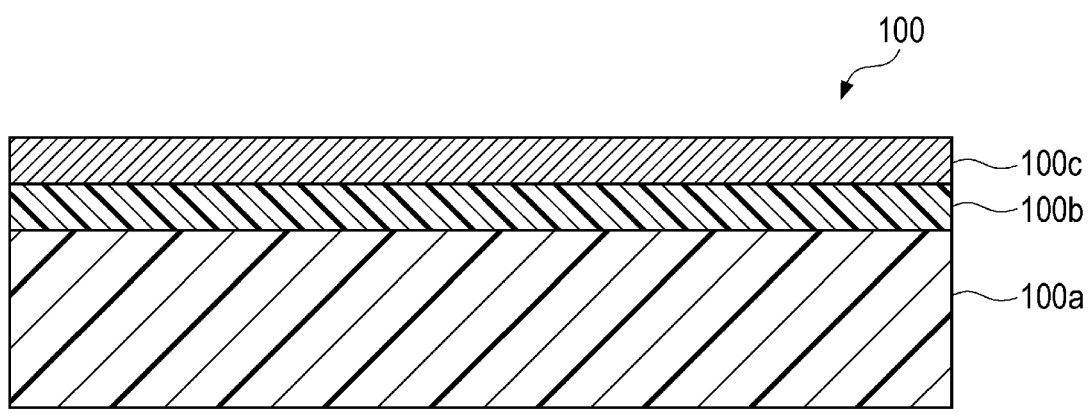
FIG. 2 schematically illustrates an example of a layer structure of a conductive foil-including film according to this exemplary embodiment.

FIG. 2 schematically illustrates an example of a layer structure of a conductive foil-including film according to this exemplary embodiment.

A conductive foil-including film 100 is formed in a film shape and includes a substrate 100*a* that is an example of a film substrate, a release layer 100*b*, and a conductive foil layer 100*c*. In the conductive foil-including film 100, the substrate 100*a*, the release layer 100*b*, and the conductive foil layer 100*c* are stacked in this order from the lower side in the drawing.

The substrate 100*a* serves as a support for the release layer 100*b* and the conductive foil layer 100*c*. The substrate 100*a* is, for example, a resin sheet or a resin film. Examples of the resin include non-fluororesins such as polyethylene terephthalate (PET), polyethylene naphthalate (PEN), polypropylene (PP), polyethersulfone, and polyimide; silicone resins; and syndiotactic polystyrene resins. The substrate 100*a* may have a single-layer structure or a multilayer structure.

The release layer 100*b* is a layer configured to ensure the release properties of the conductive foil layer 100*c* from the substrate 100*a*. The release layer 100*b* is made of, for example, a thermosetting resin, an ultraviolet-curable resin, or a material obtained by adding a wax to an electron beam-curable resin. An example of the thermosetting resin is a resin that uses melamine or isocyanate as a curing agent. An example of the ultraviolet-curable resin and the electron beam-curable resin is a resin containing an acrylate or an epoxy resin. Examples of the wax include fluorine-based monomers, silicon-based monomers, fluorine-based polymers, and silicon-based polymers. The materials used for the release layer 100*b* may be used alone or in combination of two or more. When the substrate 100*b* itself has release properties, the conductive foil-including film 100 does not necessarily include the release layer 100*b*.

The conductive foil layer 100*c* includes a metal layer containing a metal material and thus has conductivity.

The metal layer may be formed by, for example, a vapor deposition method, a sputtering method, an ion plating method, or a coating method that uses a metal material and is preferably formed by a vapor deposition method from the viewpoint of suppressing the influence of oxidation or the like and increasing the conductivity of wires. Examples of the metal material include aluminum, tin, silver, chromium nickel, gold, nickel-chromium-iron alloys, bronze, and aluminum bronze. In addition to the metal material, a material having conductivity, such as carbon black, may be contained.

The conductive foil-including film 100 may be a film in which the substrate 100*a* and the release layer 100*b* are separated from each other when the conductive foil layer 100*c* is transferred onto the toner image for conductive foil (i.e., a film in which the release layer 100*b* is also transferred onto the toner image for conductive foil together with the conductive foil layer 100*c*). Alternatively, the conductive foil-including film 100 may be a film in which the release layer 100*b* and the conductive foil layer 100*c* are separated from each other (i.e., a film in which only the conductive foil layer 100*c* is transferred onto the toner image for conductive foil). The conductive foil-including film 100 is preferably a film in which the release layer 100*b* and the conductive foil layer 100*c* are separated from each other from the viewpoint of, for example, forming a wire having a conductive surface.

Wire Forming Device

The wire forming device 80 will be described.

In the wire forming device, a conductive foil layer is formed on a toner image for conductive foil and at least heat is applied to the toner image for conductive foil and the conductive foil layer to form a wire made of conductive foil.

Figure 3:
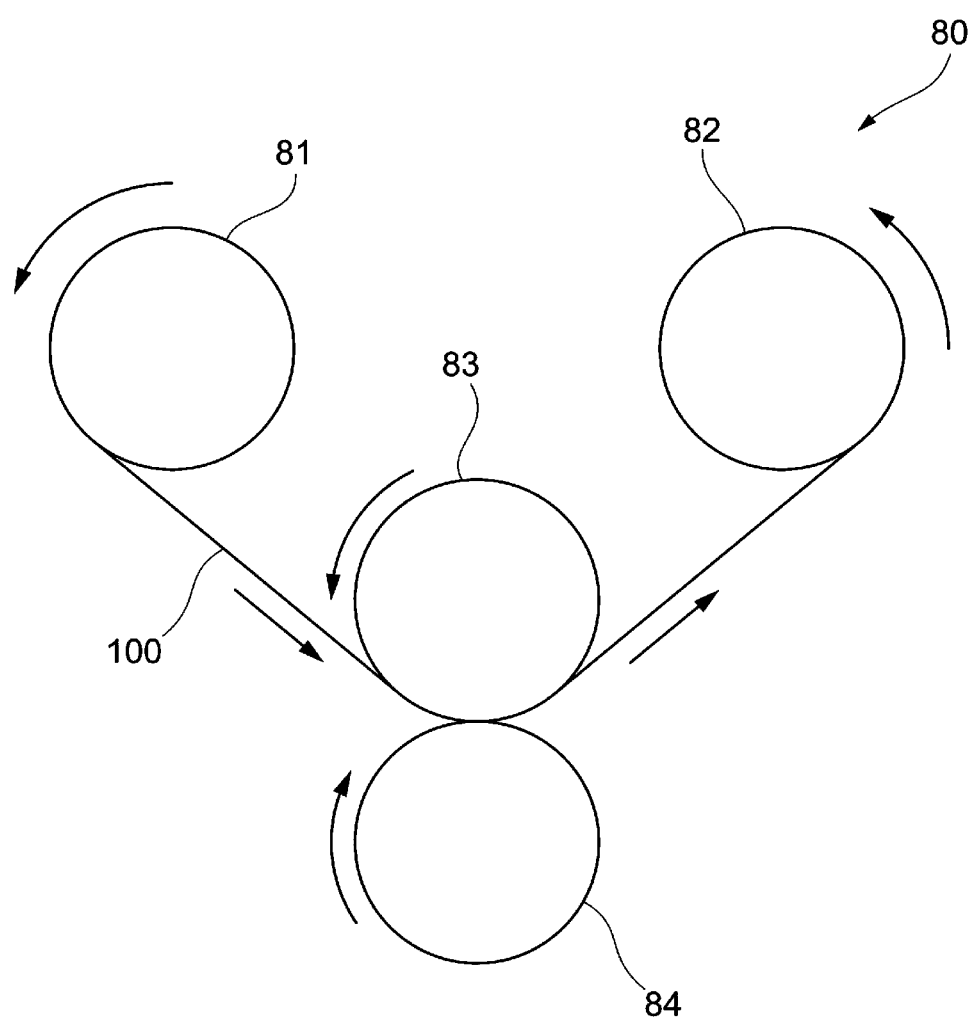
FIG. 3 schematically illustrates an example of a wire forming device in a circuit board producing apparatus according to this exemplary embodiment.

FIG. 3 schematically illustrates an example of a wire forming device 80 in a circuit board producing apparatus according to this exemplary embodiment.

The wire forming device 80 holds a long conductive foil-including film 100 formed as a single piece. The conductive foil-including film 100 is pressed against a toner image for conductive foil on a paper sheet P. The length of the long conductive foil-including film 100 in a width direction (a depth direction in the drawing) may be larger than the length of the paper sheet P in the width direction.

The wire forming device 80 includes a feeding roller 81 configured to wind the conductive foil-including film 100 in a roll and feed the conductive foil-including film 100 and a coiling roller 82 configured to coil the conductive foil-including film 100 in a roll. The wire forming device 80 also includes a foil transfer roller 83 configured to stretch the conductive foil-including film 100 and transfer the conductive foil-including film 100 onto the toner image for conductive foil on the paper sheet P and an opposing roller 84 that opposes the foil transfer roller 83 with the conductive foil-including film 100 sandwiched therebetween.

The foil transfer roller 83 is disposed between the feeding roller 81 and the coiling roller 82 so as to be closer to the substrate 100a than the conductive foil layer 100c (refer to FIG. 2) of the conductive foil-including film 100. The foil transfer roller 83 and the opposing roller 84 are pressed against each other. Herein, the opposing roller 84 includes a heating source (not illustrated) and applies heat to the toner image for conductive foil and the conductive foil layer.

The foil transfer roller 83 receives a rotational driving force from a driving motor (not illustrated) and rotates in a counterclockwise direction in the drawing. The foil transfer roller 83 presses the conductive foil-including film 100 against the toner image for conductive foil on the paper sheet P between the foil transfer roller 83 and the opposing roller 84. At this time, the foil transfer roller 83 may press the conductive foil-including film 100 in a region larger than the length of the paper sheet P in the width direction.

Method for Producing Circuit Board

The detailed steps in the method for producing a circuit board will be described.

The method for producing a circuit board according to this exemplary embodiment includes a providing step of providing a substrate on which a toner image formed of a thermoplastic toner has been formed and a wire forming step of forming a conductive foil layer having a thickness of 0.1 μm or more and 2 μm or less on the toner image that has been formed on the substrate and then applying at least heat to the toner image and the conductive foil layer to form a wire made of conductive foil. The method for producing a circuit board according to this exemplary embodiment may include other steps.

Providing Step

In the providing step, a substrate on which a toner image formed of a thermoplastic toner has been formed is provided.

The substrate is not particularly limited and may be a publicly known substrate. The substrate is, for example, a paper sheet used in electrophotographic copying machines and printers or an OHP sheet. Examples of the substrate include recording media such as coated paper obtained by coating a surface of plain paper with a resin or the like and art paper for printing; semiconductor substrates such as a silicon substrate; glass substrates; quartz substrates; stainless steel substrates; and plastic substrates.

The method for forming a toner image formed of a thermoplastic toner on a substrate is not particularly limited, and a publicly known method may be appropriately employed. The substrate may be, for example, a substrate on which a toner image formed of a thermoplastic toner has been formed in advance. For example, the substrate may be a substrate on which a guide image of a thermoplastic toner and a toner image for conductive foil have been formed using the above-described circuit board producing apparatus or the like.

Wire Forming Step

In the wire forming step, a conductive foil layer having a thickness of 0.1 μm or more and 2 μm or less is formed on the toner image that has been formed on the substrate and then at least heat is applied to the toner image and the conductive foil layer to form a wire made of conductive foil.

The temperature of the heat applied to the toner image and the conductive foil layer is preferably 50° C. or higher and 130° C. or lower, more preferably 60° C. or higher and 120° C. or lower, and further preferably 65° C. or higher and 115° C. or lower from the viewpoint of producing a circuit board having higher resistance stability.

In the wire forming step, when at least heat is applied to the toner image and the conductive foil layer, pressure may be optionally applied to form a wire made of conductive foil.

In the wire forming step, if pressure is applied to the toner image and the conductive foil layer, the pressure applied is preferably 0.05 MPa or more and 5 MPa or less, more preferably 0.1 MPa or more and 1 MPa or less, and further preferably 0.2 MPa or more and 0.8 MPa or less from the viewpoint of suppressing the deterioration of the substrate, such as formation of creases on the substrate.

In the wire forming step, heat at a temperature of 60° C. or higher and a pressure of 1 MPa or less are preferably applied to the toner image and the conductive foil layer to form a wire made of conductive foil from the viewpoint of producing a circuit board having higher resistance stability.

The method for forming a conductive foil layer on a toner image is not particularly limited. A conductive foil layer that has been formed on a film substrate may be transferred onto a toner image. Alternatively, plural powdery conductive foils may be transferred onto a toner image.

In the wire forming step, a conductive foil layer that has been formed on a film substrate is preferably transferred onto a toner image to form a wire made of conductive foil and having a conductive surface from the viewpoint of producing a circuit board having higher resistance stability.

The method for forming a conductive foil layer on a toner image using a conductive foil-including film is, for example, a method that uses a metal vapor deposition form used for hot press forming (hot stamping) or cold press forming (cold stamping). When the cold stamping is used, heat is applied to the toner image and the conductive foil layer that have been subjected to cold stamping to form a wire made of conductive foil.

The metal vapor deposition form includes a film substrate and a vapor deposition layer formed of gold, silver, copper, or aluminum (preferably aluminum) and disposed on the film substrate. The metal vapor deposition form may include a thin release layer disposed between the substrate and the metal vapor deposition layer.

Example of Method for Producing Circuit Board

Hereafter, the method for producing a circuit board will be described in detail with reference to the attached drawings.

Figure 4:
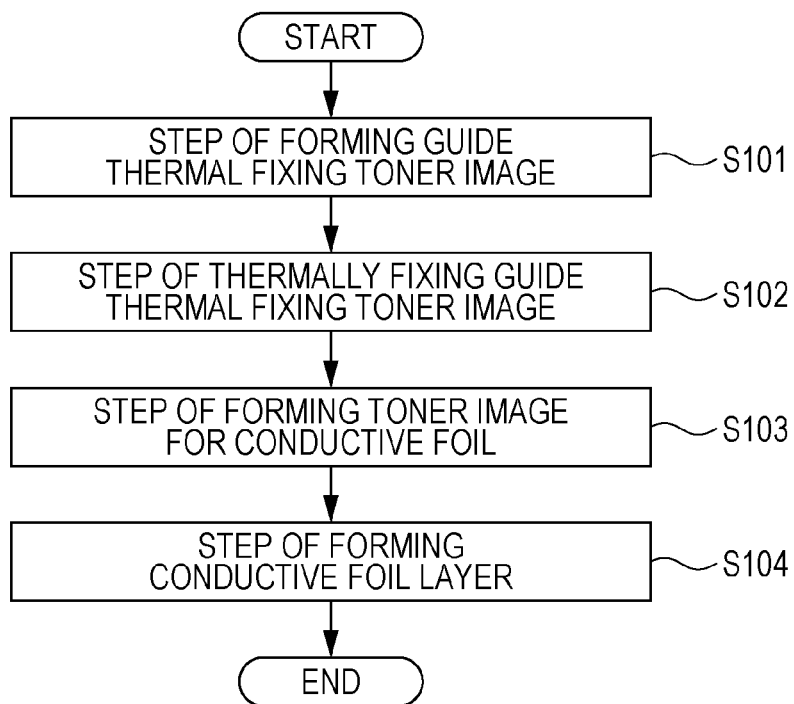
FIG. 4 is a flow chart illustrating an example of a method for producing a circuit board according to this exemplary embodiment.

FIG. 4 is a flow chart illustrating an example of the method for producing a circuit board according to this exemplary embodiment.

The guide image forming device 10 in the circuit board producing apparatus 1 (refer to FIG. 1) forms a guide thermal fixing toner image on a paper sheet P in a second transfer region 23 (Step S101: step of forming guide thermal fixing toner image). Then, the fixing unit 60 performs thermal fixing treatment on the paper sheet P on which the guide thermal fixing toner image has been formed to fix the guide thermal fixing toner image on the paper sheet P (Step S102: step of thermally fixing guide thermal fixing toner image). Steps S101 and S102 may be appropriately omitted.

A substrate on which a guide thermal fixing toner image has been formed in advance may be used.

The paper sheet P is transported to a toner image for conductive foil forming device 70 along a transport path. The toner image for conductive foil forming device 70 forms a toner image for conductive foil formed of a thermoplastic toner on the paper sheet P (Step S103: step of forming toner image for conductive foil). The step of forming a toner image for conductive foil is also regarded as a providing step of providing a substrate on which a toner image for conductive foil has been formed.

The paper sheet P on which the toner image for conductive foil has been formed is transported to the wire forming device 80. When the paper sheet P is inserted between a foil transfer roller 83 (refer to FIG. 3) and an opposing roller 84, the foil transfer roller 83 presses a conductive foil-including film 100 against the paper sheet P at a temperature of 70° C. or lower. When the toner image formed on the paper sheet P is heated while being pressed against the conductive foil-including film 100, the viscosity decreases and the toner image is bonded to a conductive foil layer 100c (refer to FIG. 2) of the conductive foil-including film 100. In the conductive foil-including film 100 that overlaps the toner image for conductive foil, the conductive foil layer 100c is separated from a substrate 100a. Thus, the conductive foil-including film 100 (the conductive foil layer 100c of the conductive foil-including film 100) is formed on the toner image on the paper sheet P (Step S104: step of forming conductive foil layer).

The substrate 100a and the release layer 100b left as a result of the separation of the conductive foil layer 100c of the conductive foil-including film 100 held by the wire forming device 80 and a remaining portion of the conductive foil-including film 100 that has not been formed on the paper sheet P are coiled by the coiling roller 82. Through the above steps, a circuit board on which a wire having a conductive surface has been formed is produced.

A semiconductor device may be attached to the produced circuit board (attaching step). That is, an integrated circuit producing apparatus including a device attachment 300 (attaching apparatus) for attaching a semiconductor device may be provided.

The method for attaching a semiconductor device to the circuit board is not particularly limited. Examples of the method include a method in which a terminal of a semiconductor device is attached to the wire using a stapler including a conductive staple while the terminal of the semiconductor device is in contact with the wire of the circuit board or a method in which a terminal of a semiconductor device is soldered to the wire using a soldering iron including a conductive adhesive solidified at room temperature or a conductive solder.

The semiconductor device is not particularly limited. Examples of the semiconductor device include diodes, transistors, and thyristors.

Through the above step, an integrated circuit in which a semiconductor device is attached to the circuit board is produced.

If the toner image for conductive foil or the conductive foil layer 100c is formed on a substrate to which the semiconductor device has been attached, using the circuit board producing apparatus 1, the semiconductor device may be damaged in a process of applying heat and pressure to the substrate in the circuit board producing apparatus 1. When the conductive foil layer 100c is formed on a substrate to which the semiconductor device has been attached, the conductive foil layer 100c is not easily formed at steps between portions of the substrate to which the semiconductor device is attached and portions of the substrate to which the semiconductor device is not attached.

In contrast, in this exemplary embodiment, the semiconductor device is attached to a substrate on which a wire has been formed. In this case, the damaging of the semiconductor device in the circuit board producing apparatus 1 is suppressed. Furthermore, the conductive foil layer 100c is easily formed on the substrate.

In this exemplary embodiment, the conductive foil layer 100c is formed on the toner image for conductive foil on the paper sheet P by pressing the conductive foil-including film 100 formed as a single piece in a film shape against the paper sheet P in the step of forming a conductive foil layer.

In this case, the portions in which the conductive foil is not formed on the toner image for conductive foil on the paper sheet P are reduced compared with the case where individually formed plural foils are formed on the paper sheet P.

In the wire forming step that uses the wire forming device 80 illustrated in FIG. 3, the conductive foil layer 100c serving as a wire is formed on the toner image for conductive foil on the paper sheet P by pressing the conductive foil-including film 100 formed as a single piece against the paper sheet P. However, the wire forming step according to this exemplary embodiment is not limited to the example of the above step.

Subsequently, a wire forming device 90 will be described.

Figure 5:
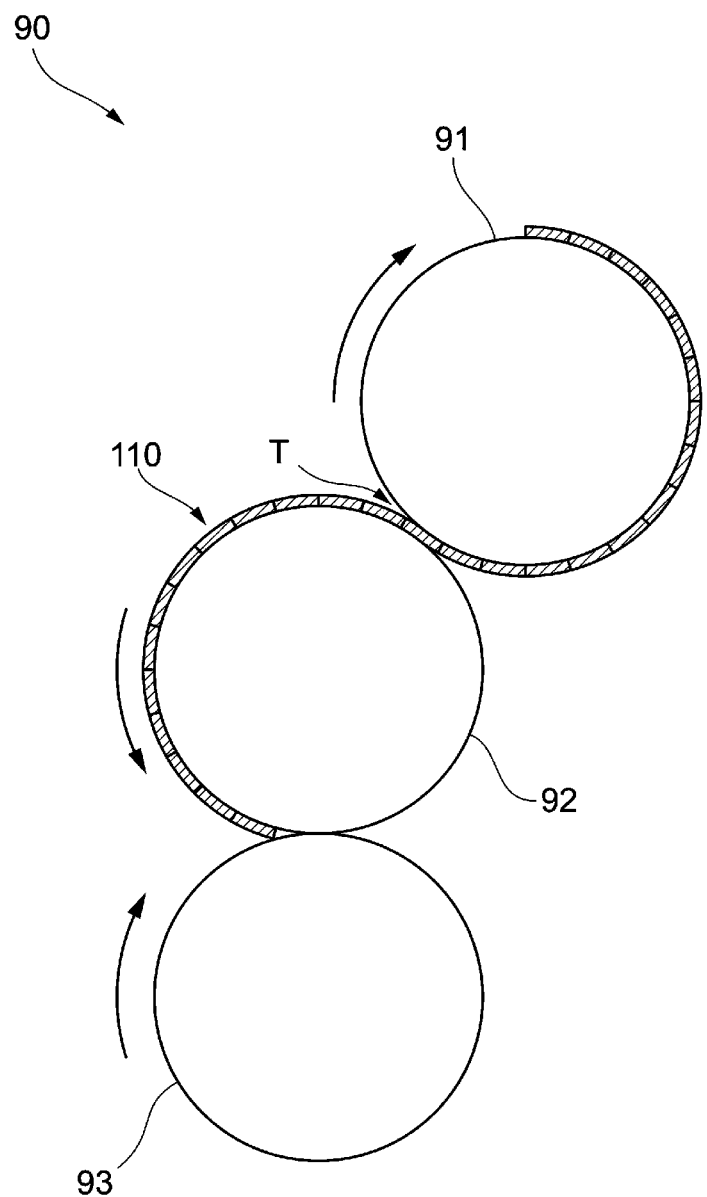
FIG. 5 schematically illustrates an example of a wire forming device in a circuit board producing apparatus according to this exemplary embodiment.

FIG. 5 schematically illustrates an example of a wire forming device 90 in the circuit board producing apparatus according to this exemplary embodiment.

The wire forming device 90 is configured to form a layer constructed from plural powdery conductive foils 110 on the toner image for conductive foil on the paper sheet P to produce a circuit board.

The conductive foils 110 illustrated in FIG. 5 contain a metal powder. Examples of the metal powder include gold powder, silver powder, aluminum powder, tin powder, chromium powder, nickel powder, and bronze powder.

The wire forming device 90 includes a retention roller 91 configured to retain the conductive foils 110, a conductive foil transfer roller 92 configured to transfer the conductive foils 110 onto the toner image for conductive foil on the paper sheet P, and an opposing roller 93 that opposes the conductive foil transfer roller 92.

The retention roller 91 has an adsorptive surface. Examples of the material having adsorptive properties include silicon rubber, urethane rubber, fluororubber, natural rubber, styrene-butadiene rubber, and nitrile rubber. The retention roller 91 may be a silicon roller or a urethane roller.

The retention roller 91 rotates while retaining the plural conductive foils 110. Specifically, the retention roller 91 rotates in a clockwise direction in the drawing while the plural conductive foils 110 supplied from a cartridge (not illustrated) that accommodates the plural conductive foils 110 are adsorbed and retained on the surface of the retention roller 91. The length of a region of the retention roller 91 in which the conductive foils 110 are adsorbed in the width direction (the depth direction in the drawing) may be larger than that of the paper sheet P in the width direction.

The conductive foil transfer roller 92 has an adsorptive surface. Examples of the material having adsorptive properties include silicon rubber, urethane rubber, fluororubber, natural rubber, styrene-butadiene rubber, and nitrile rubber. The conductive foil transfer roller 92 may be a silicon roller or a urethane roller. The adsorptive power on the surface of the conductive foil transfer roller 92 is larger than that on the surface of the retention roller 91.

The conductive foil transfer roller 92 rotates in a counterclockwise direction in the drawing. The conductive foil transfer roller 92 and the retention roller 91 are pressed against each other, and the retention roller 91 supplies the conductive foils 110 to the conductive foil transfer roller 92 in this pressed portion T. The length of a region of the conductive foil transfer roller 92 in which the conductive foils 110 are supplied in the width direction (the depth direction in the drawing) may be larger than that of the paper sheet P in the width direction.

In the wire forming device 90, as in the case of the wire forming device 80, a toner image for conductive foil is formed on the paper sheet P and then conductive foil layers are formed on the toner image that has been formed on the paper sheet P.

The paper sheet P is transported to the wire forming device 90 after the toner image for conductive foil is formed in the toner image for conductive foil forming unit (refer to FIG. 1). When the paper sheet P is inserted between the conductive foil transfer roller 92 and the opposing roller 93, the conductive foil transfer roller 92 presses plural powdery conductive foils 110 against the paper sheet P at a temperature of 70° C. or lower. At this time, the opposing roller 93 includes a heating source (not illustrated) and applies heat to the toner image and a layer constructed from the conductive foils. Thus, conductive foils 110 that overlap the toner image for conductive foil among the plural conductive foils 110 pressed against the paper sheet P by the conductive foil transfer roller 92 are bonded to the foil toner image for conductive foil. Consequently, the conductive foil layers are formed on the toner image for conductive foil on the paper sheet P. Conductive foils 110 that are not transferred onto the paper sheet P among the plural conductive foils 110 pressed against the paper sheet P by the conductive foil transfer roller 92 are continuously retained by the conductive foil transfer roller 92.

The conductive foil transfer roller 92 may press the conductive foils 110 in a region larger than the length of the paper sheet P in the width direction.

In the case where the plural powdery conductive foil layers are formed on the paper sheet P using the wire forming device 90, the amount of conductive foil that has not been transferred onto the toner image for conductive foil and is used for the subsequent formation of conductive foil increases compared with the case where the conductive foil layer is formed on the toner image for conductive foil on the paper sheet P using the conductive foil-including film 100 formed as a single piece by the wire forming device 80 illustrated in FIG. 2.

For example, when the conductive foil-including film 100 formed as a single piece so as to have the conductive foil layer structure in FIG. 2 is formed on the paper sheet P, a portion of the conductive foil-including film 100 which is retained by the wire forming device 80 and in which the conductive foil layer 100c is not left is not used for the subsequent formation of a conductive foil layer. A periphery (a portion in which the conductive foil layer 100c is left) of the portion in which the conductive foil layer 100c is not left is also not used for the subsequent formation of a conductive foil layer.

In contrast, when individually formed plural conductive foil layers are formed on the toner image for conductive foil on the paper sheet P as in the example in which the wire forming device 90 in FIG. 5 is used, conductive foils 110 that have not been transferred onto the toner image for conductive foil on the paper sheet P among the conductive foils 110 retained by the conductive foil transfer roller 92 are continuously retained by the conductive foil transfer roller 92 and used for the subsequent formation of a conductive foil layer. This increases the amount of the conductive foils 110 used for the subsequent formation of a conductive foil layer.

In this exemplary embodiment, an example in which the paper sheet P is used as a substrate has been described. However, the substrate is not particularly limited as long as the subsequent conductive foil layer is formed or a semiconductor device is attached. For example, the substrate may be a resin sheet or a resin film.

In this exemplary embodiment, the circuit board producing apparatus 1 includes the toner image for conductive foil forming device 70 and the wire forming device 80, but the configuration is not limited thereto. For example, a conductive foil layer forming apparatus including a toner image for conductive foil forming device and a wire forming device may be provided in addition to the circuit board producing apparatus 1. In this case, a guide thermal fixing toner image is first formed on a substrate using the circuit board producing apparatus. Then, the substrate on which the guide thermal fixing toner image has been formed is taken out of the circuit board producing apparatus, and a toner image for conductive foil is formed on the substrate using the toner image for conductive foil forming device. A conductive foil is pressed against the substrate on which the toner image for conductive foil has been formed using the wire forming device and then heat is applied to the conductive foil forming toner and the conductive foil layer to form a wire. Alternatively, the toner image for conductive foil forming device and the wire forming device may be provided in different apparatuses. A toner image for conductive foil may be formed on a substrate without forming a guide thermal fixing toner image and a conductive layer foil may be formed on the toner image for conductive foil.

EXAMPLES

Hereafter, the present disclosure will be further described in detail based on Examples below. The materials, the amount of use, the percentage, the procedure, and the like in Examples below may be appropriately changed without departing from the spirit of the exemplary embodiment. The "part" refers to "part by mass" unless otherwise specified.
Synthesis Example of Resins
Synthesis of Amorphous Polyester Resin A1
    Ethylene oxide adduct of bisphenol A: 150 parts
    Propylene oxide adduct of bisphenol A: 250 parts
    Terephthalic acid: 100 parts
    Tetrapropenylsuccinic anhydride: 130 parts
    Trimellitic acid: 15 parts The above monomer components are charged into a reaction vessel equipped with a stirrer, a thermometer, a condenser, and a nitrogen gas inlet tube. The reaction vessel is purged with dry nitrogen gas, and then tin dioctanoate is charged into the reaction vessel in an amount of 0.3% relative to the total amount of the monomer components. The temperature is increased to 235° C. over one hour in a nitrogen gas stream. The reaction is caused to proceed for three hours, the pressure in the reaction vessel is reduced to 10.0 mmHg, the reaction is caused under stirring, and the reaction is terminated when the molecular weight reaches an intended molecular weight. The obtained amorphous polyester resin A1 has a glass transition temperature of 60° C. and a weight-average molecular weight of 45000.

Synthesis of Amorphous Polyester Resin A2
    Ethylene oxide adduct of bisphenol A: 30 parts
    Propylene oxide adduct of bisphenol A: 270 parts
    Terephthalic acid: 60 parts
    Fumaric acid: 40 parts
    Tetrapropenylsuccinic anhydride: 40 parts
    An amorphous polyester resin A2 is obtained in the same manner as the amorphous polyester resin A1, except that the monomer components are changed to those listed above. The obtained amorphous polyester resin A2 has a glass transition temperature of 63° C. and a weight-average molecular weight of 21000.
Synthesis of Amorphous Polyester Resin A3
    Ethylene oxide adduct of bisphenol A: 240 parts
    Propylene oxide adduct of bisphenol A: 260 parts
    Terephthalic acid: 150 parts
    Trimellitic acid: 15 parts
    Tetrapropenylsuccinic anhydride: 120 parts
    An amorphous polyester resin A3 is obtained in the same manner as the amorphous polyester resin A1, except that the monomer components are changed to those listed above. The obtained amorphous polyester resin A3 has a glass transition temperature of 59° C. and a weight-average molecular weight of 28000.
Synthesis of Amorphous Polyester Resin A4
    Ethylene oxide adduct of bisphenol A: 210 parts
    Propylene oxide adduct of bisphenol A: 230 parts
    Terephthalic acid: 30 parts
    Fumaric acid: 135 parts
    An amorphous polyester resin A4 is obtained in the same manner as the amorphous polyester resin A1, except that the monomer components are changed to those listed above. The obtained amorphous polyester resin A4 has a glass transition temperature of 61° C. and a weight-average molecular weight of 19000.
Synthesis of Crystalline Polyester Resin C1
    1,10-Decanedicarboxylic acid: 350 parts
    1,6-Hexanediol: 170 parts
    The above monomer components are charged into a reaction vessel equipped with a stirrer, a thermometer, a condenser, and a nitrogen gas inlet tube. The reaction vessel is purged with dry nitrogen gas, and then tin dioctanoate is charged into the reaction vessel in an amount of 0.3 parts relative to 100 parts of the monomer components. The reaction is caused to proceed under stirring in a nitrogen gas stream at 160° C. for three hours. Then, the temperature is further increased to 180° C. over 1.5 hours, the pressure in the reaction vessel is reduced to 3 kPa, and the reaction is terminated when the molecular weight reaches a desired molecular weight to obtain a crystalline polyester resin C1. The obtained crystalline polyester resin C1 has a melting temperature of 73° C. and a weight-average molecular weight of 26000.
Synthesis of Crystalline Polyester Resin C2
    1,10-Decanedicarboxylic acid: 350 parts
    1,9-Nonanediol: 240 parts
    A crystalline polyester resin C2 is obtained in the same manner as the crystalline polyester resin C1, except that the monomer components are changed to those listed above. The obtained crystalline polyester resin C2 has a melting temperature of 78° C. and a weight-average molecular weight of 34000.
Synthesis of Crystalline Polyester Resin C3
    1,10-Decanedicarboxylic acid: 350 parts
    1,4-Butanediol: 130 parts
    A crystalline polyester resin C3 is obtained in the same manner as the crystalline polyester resin C1, except that the monomer components are changed to those listed above. The obtained crystalline polyester resin C3 has a melting temperature of 68° C. and a weight-average molecular weight of 22000.
Preparation of Dispersion Liquid
Preparation of Amorphous Polyester Resin Dispersion Liquid A1-1
    Amorphous polyester resin 1 (A1): 100 parts
    Methyl ethyl ketone: 60 parts
    Isopropyl alcohol: 10 parts
    The above components are charged into a reaction vessel equipped with a stirrer and dissolved at 60° C. After confirmation of the dissolution, the reaction vessel is cooled to 35° C. and then 3.5 parts of a 10% aqueous ammonia solution is added thereto. Subsequently, 300 parts of ion-exchanged water is added dropwise to the reaction vessel over three hours to prepare a polyester resin dispersion liquid. Subsequently, methyl ethyl ketone and isopropyl alcohol are removed using an evaporator to obtain an amorphous polyester resin dispersion liquid A1-1.
Preparation of Amorphous Polyester Resin Dispersion Liquid A2-1
    An amorphous polyester resin dispersion liquid A2-1 is obtained in the same manner as the amorphous polyester resin dispersion liquid A1-1, except that the resin used is changed to the amorphous polyester resin (A2).
Preparation of Amorphous Polyester Resin Dispersion Liquid A3-1
    An amorphous polyester resin dispersion liquid A3-1 is obtained in the same manner as the amorphous polyester resin dispersion liquid A1-1, except that the resin used is changed to the amorphous polyester resin (A3).
Preparation of Amorphous Polyester Resin Dispersion Liquid A4-1
    An amorphous polyester resin dispersion liquid A4-1 is obtained in the same manner as the amorphous polyester resin dispersion liquid A1-1, except that the resin used is changed to the amorphous polyester resin (A4).
Preparation of Crystalline Polyester Resin Dispersion Liquid C1-1
    Crystalline polyester resin (C1): 100 parts
    Methyl ethyl ketone: 60 parts
    Isopropyl alcohol: 15 parts
    The above components are charged into a reaction vessel equipped with a stirrer and dissolved at 65° C. After confirmation of the dissolution, the reaction vessel is cooled to 60° C. and then 5 parts of a 10% aqueous ammonia solution is added thereto. Subsequently, 300 parts of ion-exchanged water is added dropwise to the reaction vessel over three hours to prepare a polyester resin dispersion liquid. Subsequently, methyl ethyl ketone and isopropyl alcohol are removed using an evaporator to obtain a crystalline polyester resin dispersion liquid C1-1.
Preparation of Crystalline Polyester Resin Dispersion Liquid C2-1
    A crystalline polyester resin dispersion liquid C2-1 is obtained in the same manner as the crystalline polyester resin dispersion liquid C1-1, except that the resin used is changed to the crystalline polyester resin (C2).
Preparation of Crystalline Polyester Resin Dispersion Liquid C3-1
    A crystalline polyester resin dispersion liquid C3-1 is obtained in the same manner as the crystalline polyester resin dispersion liquid C1-1, except that the resin used is changed to the crystalline polyester resin (C3).

Preparation of Release Agent Dispersion Liquid

The components below are mixed with each other. After the release agent is dissolved at an inner liquid temperature of 120° C. with a pressure discharge homogenizer (Gaulin Homogenizer, manufactured by Gaulin), the mixture is subjected to dispersion treatment at a dispersion pressure of 5 MPa for 120 minutes and then at 40 MPa for 360 minutes and cooled to prepare a release agent dispersion liquid. The particles in the release agent dispersion liquid have a volume-average particle diameter D50v of 210 nm. Then, ion-exchanged water is added so that the solid content is controlled to 20.0%.

Hydrocarbon wax (manufactured by NIPPON SEIRO Co., Ltd., Product name: FNP0090, melting temperature Tw=90.2° C.): 270 parts Anionic surfactant (manufactured by TAYCA Corporation, TAYCA POWER BN2060, active component: 60%): 13.5 parts (3.0% relative to the release agent in terms of active component)

Ion-exchanged water: 700 parts

Example 1

Production of Toner Particles 1

Each of weighed dispersion liquids below is charged into a stainless steel round-bottom flask. Then, ion-exchanged water is added so that the solid content is controlled to 12.5% and furthermore 6.3 parts of a 10% aqueous aluminum sulfate solution is added thereto. Subsequently, mixing and dispersion are performed with a homogenizer (manufactured by IKA, ULTRA-TURRAX T50) at 5000 rpm for 10 minutes. Then, the contents in the flask are heated to 40° C. under stirring and further heated at 0.5° C./min to a temperature at which the particle diameter reaches 4.5 µm, and the temperature is maintained. Thus, core particles are produced.

Amorphous polyester resin dispersion liquid A1-1: 21.5 parts

Amorphous polyester resin dispersion liquid A2-1: 21.5 parts

Crystalline polyester resin dispersion liquid C1-1: 30 parts

Each of dispersion liquids below is weighed and added to the dispersion liquid in which the core particles have been formed, and the resulting mixture is held for 60 minutes. As a result of the observation of the obtained mixture with an optical microscope, the generation of aggregated particles is confirmed. After 11 parts of tetrasodium ethylenediaminetetraacetate (EDTA) (manufactured by CHELEST Corporation, CHELEST 40) is added, an aqueous sodium hydroxide solution is added to control the pH to 8. Subsequently, the temperature is increased to 82.5° C. and then the pH is decreased by 0.05 every ten minutes using nitric acid and stirring is performed for 45 minutes. After cooling, the resulting product is filtered, sufficiently washed with ion-exchanged water, and then dried to obtain toner particles 1 having a core-shell structure.

Amorphous polyester resin dispersion liquid A1: 24 parts

Release agent dispersion liquid: 3 parts

Preparation of Thermoplastic Toner 1

To 100 parts of the toner particles 1, 1.5 parts of hydrophobic silica (manufactured by NIPPON AEROSIL Co., Ltd., RY50) is added, and mixing is performed using a sample mill at 13000 rpm for 30 seconds. Subsequently, sieving is performed using a vibrating screen with an opening of 45 µm to prepare a thermoplastic toner 1. The particle diameter of toner particles in the colorless thermoplastic toner 1 is measured with a Coulter Counter. The volume-average particle diameter D50 is 6.8 µm and the volume particle size distribution index GSDv is 1.22. The volume ratio of toner particles having a particle diameter of 16 µm or more is 0.5%. The thermoplastic toner 1 is fixed to an embedding material, sliced, and observed with a transmission electron microscope. It is confirmed that the thermoplastic toner 1 has a core-shell structure. The thermoplastic toner 1 has a flow-start temperature of 72° C. and a half-fall temperature of 86° C.

Preparation of Resin Coating Carrier

The components below other than ferrite particles and glass beads (ɸ1 mm, the same amount as that of toluene) are stirred with a sand mill manufactured by Kansai Paint Co., Ltd. at 1200 rpm for 30 minutes to obtain a resin coating layer forming solution. Furthermore, the resin coating layer forming solution and ferrite particles are inserted into a vacuum degassing kneader, and pressure reduction, distillation of toluene, and drying are performed to prepare a resin coating carrier (C).

Mn—Mg—Sr ferrite particles (average particle diameter 40 µm): 100 parts

Toluene: 14 parts

Cyclohexyl methacrylate/dimethylaminoethyl methacrylate copolymer (mass ratio 99:1, Mw 80000): 2.0 parts Carbon black (VXC72: manufactured by CABOT): 0.12 parts Production of Developer To a 2 liter V-blender, 36 parts of the thermoplastic toner 1 and 414 parts of the carrier are inserted and stirred for 20 minutes. Then, the mixture is sieved using a mesh with an opening of 212 µm to produce a developer.

Production of Circuit Board

The developer is set in a DocuPrint P450 manufactured by Fuji Xerox Co., Ltd.

A sample image with a human figure at the center is formed with a DocuCentre C7550I manufactured by Fuji Xerox Co., Ltd. using an OK Top Coat paper (A4 127GSM (registered trademark)) manufactured by Oji Paper Co., Ltd. as a substrate. The sample image is fixed to prepare a fixed image.

Figure 6:
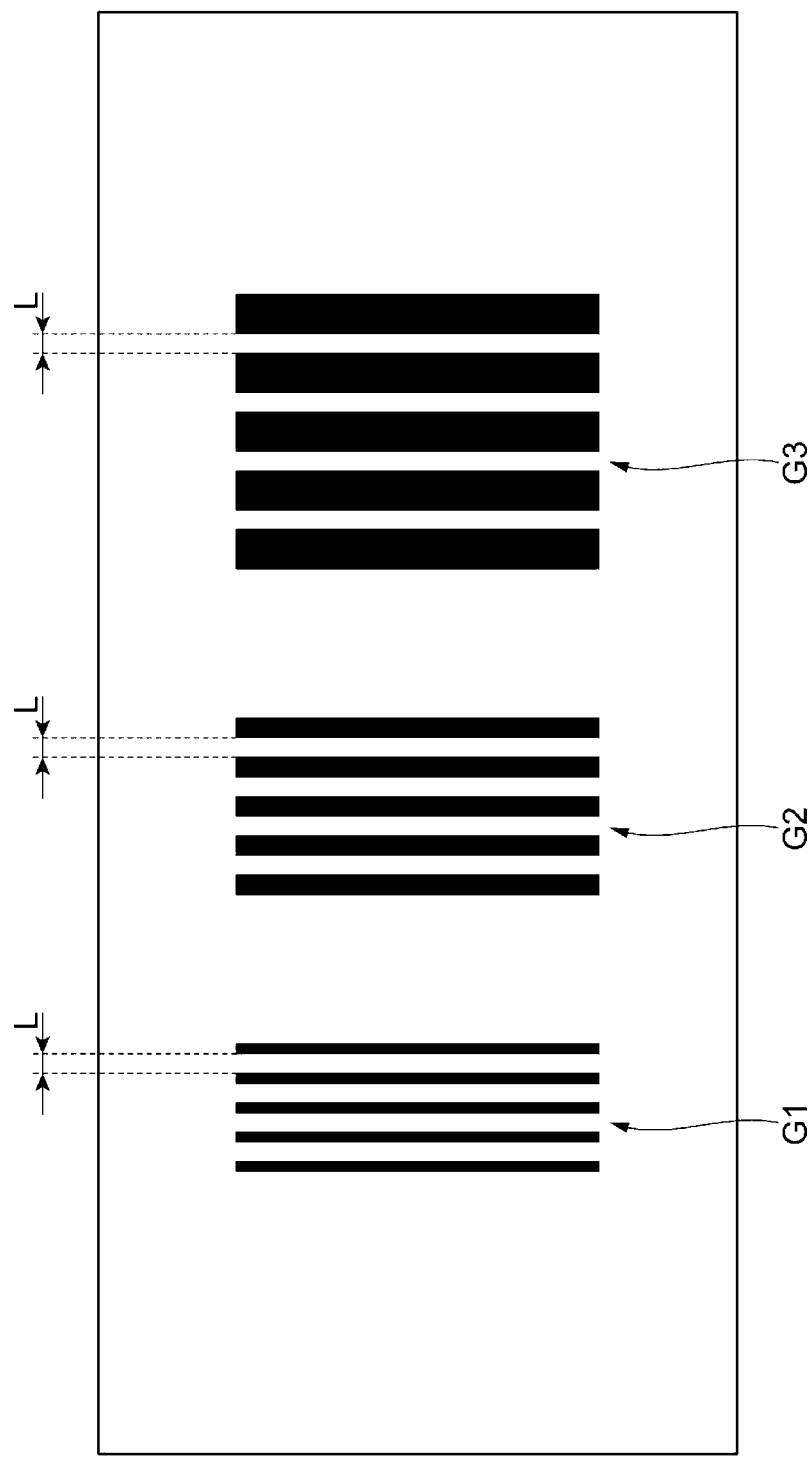
FIG. 6 schematically illustrates a substrate used for evaluating the presence or absence of short-circuits.

The paper sheet on which the fixed image has been formed is loaded into the DocuPrint P450. As illustrated in FIG. 6, three types of linear toner images having different widths are formed on the substrate so as to each have five lines. Specifically, five lines of a toner image G1 having a width of about 0.4 mm (spacing 0.8 mm), five lines of a toner image G2 having a width of about 1 mm (spacing 2 mm), and five lines of a toner image G3 having a width of about 2 mm (spacing 4 mm) are formed. The distance L between adjacent lines of the toner image G1, the distance L between adjacent lines of the toner image G2, and the distance L between adjacent lines of the toner image G3 are all about 1 mm.

A conductive foil-including film whose conductive foil layer is an aluminum vapor deposition layer having a thickness of 0.5 µm is placed on the toner image that has been formed on the substrate, and the substrate is passed through a roller heated to 90° C. while pressure (0.6 MPa) is applied. Consequently, an aluminum vapor deposition transfer foil is transferred onto the toner image formed of a thermoplastic toner. Thus, wires having a thickness of 0.5 µm are formed. Two needle terminals of a digital multimeter are set on the end portions of each linear wire, and the electrical continuity is confirmed through a buzzer sound.

Example 2

Production of Toner Solution

The dispersion liquids below serving as toner core components are mixed with each other at the ratio below. Then, moisture is removed with a hot air dryer to obtain a mixture resin X. It is observed that the mixture resin X itself becomes cloudy after the drying and phase separation is caused in a microscopic manner.

Amorphous polyester resin dispersion liquid A3-1: 35 parts

Amorphous polyester resin dispersion liquid A4-1: 35 parts

Crystalline polyester resin dispersion liquid C1-1: 30 parts

Subsequently, the components below are mixed with each other and dispersed with a ball mill using zirconia balls for three hours.

Mixture resin X: 100 parts
THF: 300 parts
Ethyl acetate: 300 parts

Preparation of Calcium Carbonate Dispersion Liquid

The components below are mixed with each other and dispersed with a ball mill using zirconia balls for two hours. Then, 900 parts of ion-exchanged water is further added thereto and uniform mixing is performed with a homogenizer to prepare a calcium carbonate dispersion liquid.

Calcium carbonate (LUMINUS, manufactured by MARUO CALCIUM Co., Ltd.): 200 parts

Anionic surfactant (NEOGEN RK, manufactured by DKS Co., Ltd.): 5 parts

Ion-exchanged water: 400 parts

Production of Thermoplastic Toner 2

The above toner solution is added to the obtained calcium carbonate dispersion liquid while a homogenizer is operated to cause emulsification. Then, the solvent is removed under heating at 40° C. over four hours. After 400 parts of 1N hydrochloric acid is further added thereto to dissolve the calcium carbonate, the resulting solution is passed through a 15 micrometer nylon mesh, then filtered, sufficiently washed with ion-exchanged water, and then subjected to solid-liquid separation through Nutsche suction filtration. The resulting product is dispersed in ion-exchanged water at 40° C. again, and stirred and washed using a stainless steel impeller at 100 rpm for 15 minutes. This washing process is repeatedly performed three times and solid-liquid separation is performed through Nutsche suction filtration. Subsequently, the moisture content is adjusted to 40% and then drying is performed with a flash jet dryer at an inlet air stream temperature of 80° C. The particle diameter of toner particles of the resulting colorless thermoplastic toner 2 is measured with a Coulter Counter. The volume-average particle diameter D50 is 8.3 μm and the volume particle size distribution index GSDv is 1.26. The volume ratio of toner particles having a diameter of 16 μm or more is 0.7%.

The thermoplastic toner 2 is fixed to an embedding material, sliced, and observed with a transmission electron microscope. It is confirmed that the thermoplastic toner 2 has a core-shell structure including a top layer (shell layer) formed of calcium carbonate particles. The obtained thermoplastic toner 2 has a flow-start temperature of 75° C. and a half-fall temperature of 88° C.

Production of Developer

A developer is produced in the same manner as in Example 1, except that the thermoplastic toner 2 is used.

Production of Circuit Board

The developer is set in a DocuPrint P450 manufactured by Fuji Xerox Co., Ltd.

A substrate is provided in the same manner as in Example 1, except that an OK Top Coat paper (A4 127GSM (registered trademark)) which is manufactured by Oji Paper Co., Ltd. and to which a polypropylene film having a thickness of 20 μm is attached is used. Three types of linear toner images having different widths are formed on the substrate so as to each have five lines as illustrated in FIG. 6.

A donor roller to which a silver foil powder with a thickness of 0.3 μm has been attached is placed on the toner image that has been formed on the substrate, and the coated paper to which the polypropylene film has been attached is passed through the roller heated to 90° C. while pressure (0.6 MPa) is applied. Consequently, a silver foil is transferred onto the toner image formed of a thermoplastic toner. Thus, wires having a thickness of 0.4 μm are formed. Two needle terminals of a digital multimeter are set on the end portions of each linear wire, and the electrical continuity is confirmed through a buzzer sound.

Example 3

A circuit board is produced in the same manner as in Example 1, except that the temperature of the roller is set to 80° C. in the production of the circuit board.

Example 4

A circuit board is produced in the same manner as in Example 1, except that the temperature of the roller is set to 70° C. and the conductive foil in the production of the circuit board is changed to a conductive foil-including film that includes a polystyrene-based release film (Oidys H N, thickness 12 μm) manufactured by KURABO INDUSTRIES Ltd. as a substrate layer and a copper vapor deposition layer having a thickness of 0.3 μm as a conductive foil layer. The surface of the wire is not covered with a release layer and is a conductive surface.

Example 5

A circuit board is produced in the same manner as in Example 1, except that the thermoplastic toner is changed to a thermoplastic toner 5 not having a core-shell structure in the production of the circuit board. The thermoplastic toner has a volume-average particle diameter D50 of 9.5 μm and a volume particle size distribution index GSDv of 1.29. The volume ratio of particles having a diameter of 16 μm or more is 1.2%. A method (kneading-pulverizing process) for producing the thermoplastic toner 5 not having a core-shell structure will be described below.

Production of Toner Particles 5 by Kneading-Pulverizing Process

The mixture resin X used in Example 2 is kneaded with a Banbury mixer, then rolled, and cooled. Subsequently, the resulting product is roughly pulverized with a hammer mill, finely pulverized with a jet mill, and then classified with an elbow jet classifier to produce a thermoplastic toner 5 not having a core-shell structure.

Preparation of Thermoplastic Toner 5

To 100 parts of the obtained toner particles 5, 1.5 parts of hydrophobic silica (manufactured by NIPPON AEROSIL Co., Ltd., RY50) is added, and mixing is performed using a sample mill at 13000 rpm for 30 seconds. Subsequently, sieving is performed using a vibrating screen with an opening of 45 μm to prepare a thermoplastic toner 5.

Example 6

A thermoplastic toner 6 is produced in the same manner as in Example 1, except that the types and amounts of resin dispersion liquids used for preparing the core particles in the production of the toner particles are changed to those listed below. The particle diameter of toner particles of the colorless thermoplastic toner 6 is measured with a COULTER COUNTER. The volume-average particle diameter D50 is 8.8 μm and the volume particle size distribution index GSDv is 1.25. The volume ratio of toner particles having a diameter of 16 μm or more is 0.9%. The thermoplastic toner 6 is fixed to an embedding material, sliced, and observed with a transmission electron microscope. It is confirmed that the thermoplastic toner 6 has a core-shell structure including a top layer (shell layer) formed of calcium carbonate particles. The thermoplastic toner 6 has a flow-start temperature of 82° C. and a half-fall temperature of 98° C.

A circuit board is produced using the obtained thermoplastic toner 6. The circuit board is produced in the same manner as in Example 1, except that the temperature of the roller is set to 90° C. and then further increased to 110° C. in the production of the circuit board.

Amorphous polyester resin dispersion liquid A1-1: 33.5 parts

Amorphous polyester resin dispersion liquid A2-1: 33.5 parts

Crystalline polyester resin dispersion liquid C1-1: 5 parts

Example 7

A circuit board is produced in the same manner as in Example 1, except that the thickness of the conductive foil is changed to 0.11 μm in the production of the circuit board.

Example 8

A circuit board is produced in the same manner as in Example 1, except that the thickness of the conductive foil is changed to 2.0 μm in the production of the circuit board.

Example 9

A circuit board is produced in the same manner as in Example 1, except that the thickness of the conductive foil is changed to 0.8 μm in the production of the circuit board.

Example 10

A circuit board is produced in the same manner as in Example 1, except that a thermoplastic toner in which the volume ratio of toner particles having a particle diameter of 16 μm or more is 2.0% relative to the total volume of the toner particles is used in the production of the circuit board.

Comparative Example 1

A circuit board is produced in the same manner as in Example 1, except that the thickness of the conductive foil is changed to 0.07 μm in the production of the circuit board.

Comparative Example 2

A circuit board is produced in the same manner as in Example 1, except that the thickness of the conductive foil is changed to 2.1 μm in the production of the circuit board.

Comparative Example 3

A circuit board is produced in the same manner as in Example 1, except that the wire is formed without applying heat in the wire forming step in the production of the circuit board.

Table 1 illustrates the properties of the thermoplastic toner and the conditions of the method for producing a circuit board in each of Examples and Comparative Examples. In the column that indicates the temperature of heat applied in the wire forming step in Table 1, "-" is given to the case where heat is not applied.

Evaluation

Evaluation of Presence or Absence of Short-Circuit

The presence or absence of short-circuits is evaluated for the circuit board produced in each of Examples and Comparative Examples.

FIG. 6 schematically illustrates a substrate used for evaluating the presence or absence of short-circuits.

As illustrated in FIG. 6, three types of linear toner images having different widths are formed on the substrate so as to each have five lines. Specifically, five lines of a toner image G1 having a width of about 0.4 mm, five lines of a toner image G2 having a width of about 1 mm, and five lines of a toner image G3 having a width of about 2 mm are formed. The distance L between adjacent lines of the toner image G1, the distance L between adjacent lines of the toner image G2, and the distance L between adjacent lines of the toner image G3 are all about 1 mm. Foils are formed on the toner image G1, the toner image G2, and the toner image G3 of the substrate. Thus, a circuit board including five wires each having a width of about 0.4 mm, five wires each having a width of about 1 mm, and five wires each having a width of about 2 mm is produced. By this method, ten circuit boards are produced.

The presence or absence of short-circuits is evaluated for each of the obtained circuit boards using a digital multimeter. Specifically, one terminal of the digital multimeter is brought into contact with one of adjacent wires of the five wires having a width of about 0.4 mm and the other terminal of the digital multimeter is brought into contact with the other wire. The presence or absence of short-circuits is evaluated by whether electrical continuity is provided. The presence or absence of short-circuits is also evaluated for the wires having a width of about 1 mm and the wires having a width of about 2 mm. The evaluation criteria are as follows. In the following evaluation criteria, the evaluation A is regarded as "Pass" and the evaluation B is regarded as "Failure". Table 1 illustrates the evaluation results in Examples and Comparative Examples.

A: Short-circuits are not confirmed in all the circuit boards.

B: Short-circuits are confirmed in at least one of the circuit boards.

Evaluation 1 of Resistance Stability

Figure 7:
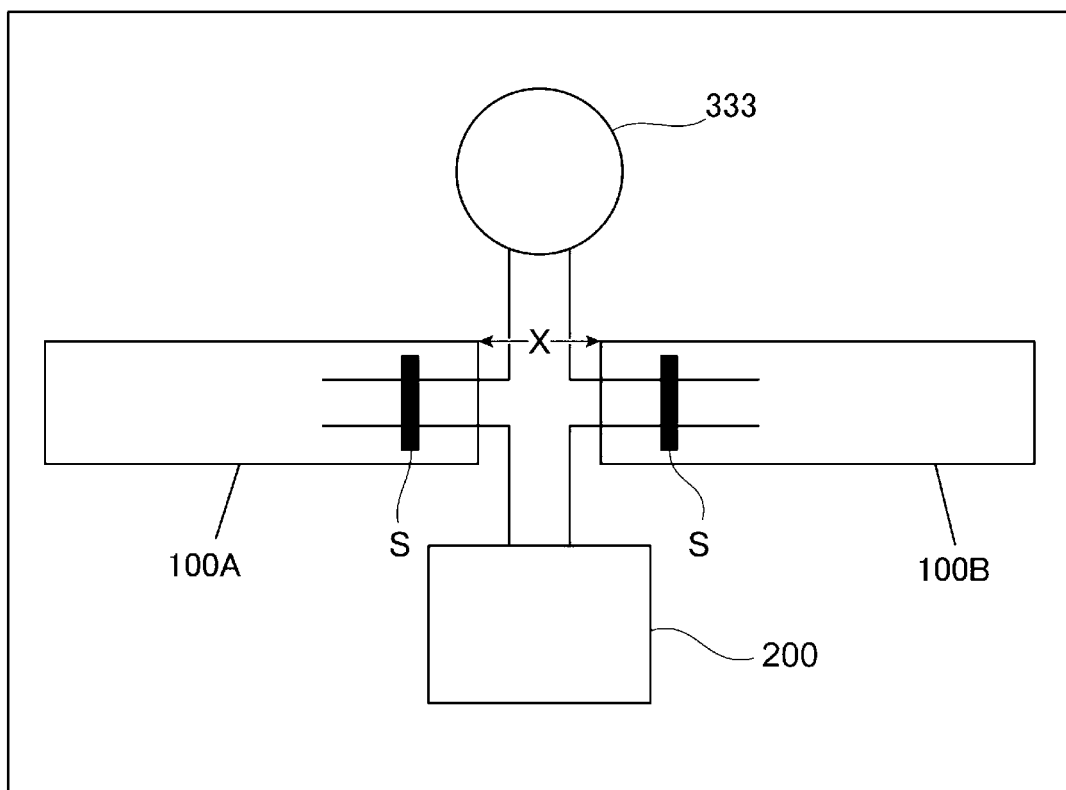
FIG. 7 schematically illustrates an integrated circuit used for the evaluation 1 of resistance stability.

FIG. 7 schematically illustrates an integrated circuit used for the evaluation 1 of resistance stability.

Two toner images having a length of 3 cm and a width of 1 cm are formed in series on a PET film substrate having a thickness of 100 μm using the developer in each of Examples and Comparative Examples. The distance X between the two toner images is set to 1 cm. Then, conductive foil layers are formed on the two toner images on the substrate to produce a circuit board. A strip including the two wiring portions and having a size of 4 cm×8 cm is cut out.

A Schottky barrier diode 200 (1SS106, manufactured by Renesas Electronics Corporation) and a light-emitting diode 333 (LED OSDR3133A, manufactured by OptoSupply) are mounted to the two wiring portions as circuit modules to produce a rectenna serving as an integrated circuit. Specifically, one terminal (left terminal in FIG. 7) of the Schottky barrier diode 200 and one terminal (left terminal in FIG. 7) of the light-emitting diode 333 are connected to the wire 100A using a polished conductive staple S (No. 10, manufactured by MAX Co., Ltd.). The other terminal (right terminal in FIG. 7) of the Schottky barrier diode 200 and the other terminal (right terminal in FIG. 7) of the light-emitting diode 333 are connected to the wire 100B using the staple S.

This rectenna receives radio waves with a frequency of 2.4 GHz, the Schottky barrier diode 200 converts the generated alternating current to a direct current, and the light-emitting diode 333 emits light using the converted direct current.

The operation of the semiconductor device in this integrated circuit is evaluated by whether the light-emitting diode emits light or not when radio waves with a frequency of 2.4 GHz are transmitted to the rectenna. The evaluation criteria are as follows. Table 1 illustrates the evaluation results in Examples and Comparative Examples.

A: Light emission from the light-emitting diode 333 is confirmed.

B: Light emission from the light-emitting diode 333 is unstable, that is, light is sometimes emitted and sometimes not.

Evaluation 2 of Resistance Stability

Figure 8:
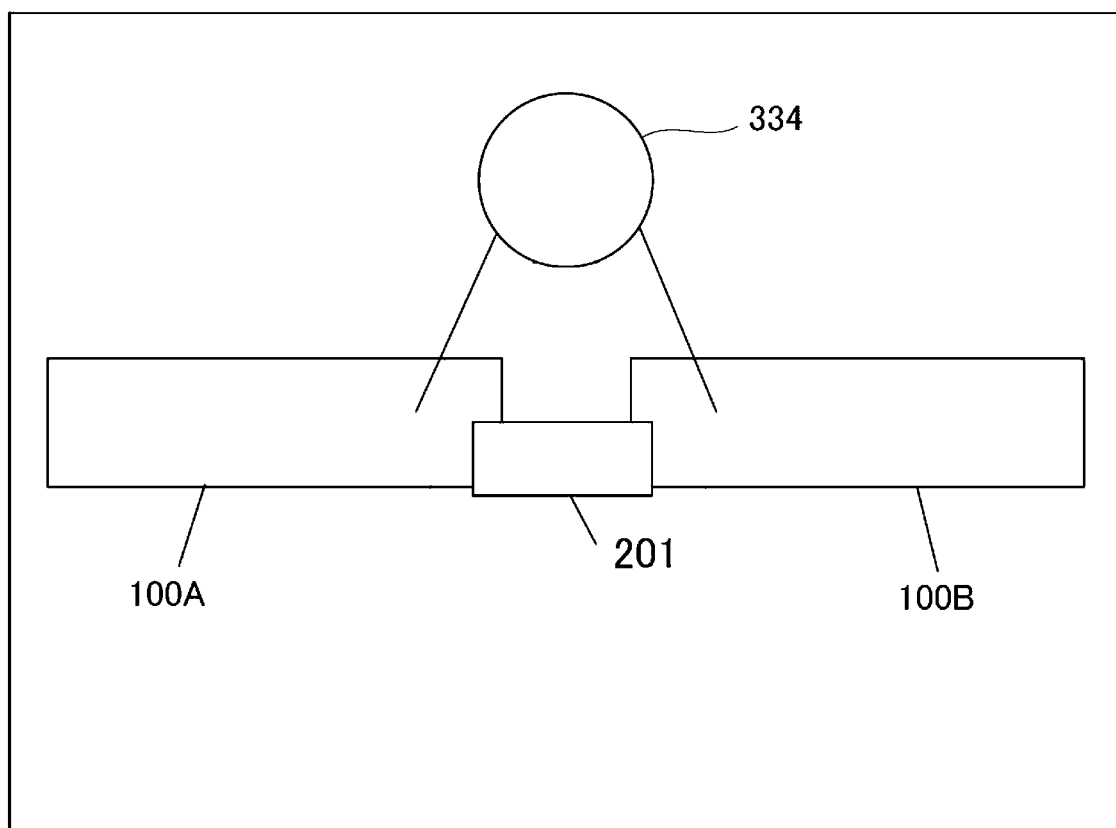
FIG. 8 schematically illustrates an integrated circuit used for the evaluation 2 of resistance stability.

FIG. 8 schematically illustrates an integrated circuit used for the evaluation 2 of resistance stability.

As in the case of the evaluation 1 of resistance stability, conductive foil layers are formed on two toner images on the substrate using the developer in each of Examples and Comparative Examples to produce a circuit board. A strip including the two wiring portions and having a size of 4 cm×8 cm is cut out.

A surface mount Schottky barrier diode 201 (1SS106, manufactured by Renesas Electronics Corporation) and a light-emitting diode 334 (LED OSDR3133A, manufactured by OptoSupply) are mounted to the two wiring portions as circuit modules to produce a rectenna serving as an integrated circuit. Specifically, one terminal of the surface mount Schottky barrier diode (HSMS-2820) 201 is connected to one end of the wire 100A using a conductive paint (Electric Paint) manufactured by Bare Conductive instead of the staple in the evaluation 1 of resistance stability. Similarly, the other terminal of the surface mount Schottky barrier diode 201 is connected to one end of the wire 100B. One terminal (left terminal in FIG. 8) of the light-emitting diode (LED OSDR3133A, manufactured by OptoSupply) 334 is connected to one end of the wire 100A using the conductive paint, and the other terminal (right terminal in FIG. 8) is connected to one end of the wire 100B.

When a smartphone in a Wi-Fi (registered trademark) mode comes close to the rectenna while lead wires of the light-emitting diode 334 are in contact with conductive wiring surfaces, the light-emitting diode 334 emits light.

The operation of the semiconductor device in this integrated circuit is evaluated by whether the light-emitting diode emits light or not when radio waves with a frequency of 2.4 GHz are transmitted to the rectenna. The evaluation criteria are as follows. Table 1 illustrates the evaluation results in Examples and Comparative Examples.

A: Light emission from the light-emitting diode 334 is confirmed.

B: Light emission from the light-emitting diode 334 is unstable, that is, light is sometimes emitted and sometimes not.

Evaluation of Blocking Durability

The thermoplastic toner used in each of Examples and Comparative Examples is left to stand at a temperature of 50° C. and a humidity of 50% for 17 hours. Then, the thermoplastic toner is sieved using a mesh with an opening of 35 μm, and the blocking durability is evaluated from the amount of thermoplastic toner on the mesh on the basis of the following criteria.

A: The thermoplastic toner is not left on the mesh.

B: The thermoplastic toner is slightly left on the mesh.

TABLE 1

| | Thermoplastic toner | | | | Production of circuit board | | | Evaluation | | | |
|---|---|---|---|---|---|---|---|---|---|---|---|
| | Volume ratio of toner particles having 16 μm or more [%] | Flow-start temperature [° C.] | Half-fall temperature [° C.] | Structure of toner particles | Thickness of conductive foil [μm] | Temperature*1 [° C.] | Pressure*2 [MPa] | Evaluation of presence or absence of short-circuit | Evaluation 1 of resistance stability | Evaluation 2 of resistance stability | Evaluation of blocking durability |
| Example 1 | 0.5 | 72 | 86 | Core-shell | 0.5 | 90 | 0.6 | A | A | A | A |
| Example 2 | 0.7 | 75 | 88 | Core-shell | 0.3 | 90 | 0.6 | A | A | A | A |
| Example 3 | 0.5 | 72 | 86 | Core-shell | 0.5 | 80 | 0.6 | A | A | A | A |
| Example 4 | 0.5 | 72 | 86 | Core-shell | 0.3 | 70 | 0.6 | A | A | A | A |
| Example 5 | 1.2 | 75 | 90 | Single layer | 0.5 | 90 | 0.6 | B | A | A | B |
| Example 6 | 0.9 | 82 | 98 | Core-shell | 0.5 | 90-110 | 0.6 | A | A | A | A |
| Example 7 | 0.5 | 72 | 86 | Core-shell | 0.11 | 90 | 0.6 | A | A | A | A |
| Example 8 | 0.5 | 72 | 86 | Core-shell | 2.0 | 90 | 0.6 | A | A | A | A |
| Example 9 | 0.5 | 72 | 86 | Core-shell | 0.8 | 90 | 0.6 | A | A | A | A |
| Example 10 | 2 | 72 | 86 | Core-shell | 0.5 | 90 | 0.6 | B | A | A | A |
| Comparative Example 1 | 0.5 | 72 | 86 | Core-shell | 0.07 | 90 | 0.6 | A | B | B | A |

TABLE 1-continued

| | Thermoplastic toner | | | | Production of circuit board | | | Evaluation | | | |
|---|---|---|---|---|---|---|---|---|---|---|---|
| | Volume ratio of toner particles having 16 μm or more [%] | Flow-start temperature [° C.] | Half-fall temperature [° C.] | Structure of toner particles | Thickness of conductive foil [μm] | Temperature*1 [° C.] | Pressure*2 [MPa] | presence or absence of short-circuit | Evaluation 1 of resistance stability | Evaluation 2 of resistance stability | Evaluation of blocking durability |
| Comparative Example 2 | 0.5 | 72 | 86 | Core-shell | 2.1 | 90 | 0.6 | B | A | B | A |
| Comparative Example 3 | 0.5 | 72 | 86 | Core-shell | 0.5 | — | 0.6 | Not transferred, and wire is not formed. | | | A |

*1Temperature [° C.] of heat applied in the wire forming step
*2Pressure [MPa] applied in the wire forming step The above results show that a wire having higher resistance stability is produced by the method for producing a circuit board in Examples than by the method for producing a circuit board in Comparative Examples. More specifically, the method for producing a circuit board in Examples shows better results than the method for producing a circuit board in Comparative Examples in two or more of the three evaluations, that is, the evaluation of short-circuits and the evaluations 1 and 2 of resistance stability. In particular, in the method for producing a circuit board in Comparative Example 3 in which heat is not applied in the wire forming step, a conductive foil is not transferred onto the toner image and thus a wire is not formed.

The foregoing description of the exemplary embodiment of the present disclosure has been provided for the purposes of illustration and description. It is not intended to be exhaustive or to limit the disclosure to the precise forms disclosed. Obviously, many modifications and variations will be apparent to practitioners skilled in the art. The embodiment was chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A method for producing a circuit board, comprising:
providing a substrate;
forming a toner image on the substrate using a thermoplastic toner, wherein the thermoplastic toner contains toner articles in which a volume ratio of particles having a particle diameter of 16 μm or more is 1% or less relative to a total volume of the toner particles; and
forming a conductive foil layer having a thickness of 0.1 μm to 2 μm on the formed toner image on the substrate and simultaneously heating the formed toner image and the conductive foil layer to form a conductive wire constituted by the conductive foil layer.

2. The method for producing a circuit board according to claim 1, wherein the thermoplastic toner has a flow-start temperature of 80° C. or lower and a half-fall temperature of 95° C. or lower under heating.

3. The method for producing a circuit board according to claim 2, wherein the flow-start temperature of the thermoplastic toner is 50° C. to 75° C. and the half-fall temperature of the thermoplastic toner is 60° C. to 86° C.

4. The method for producing a circuit board according to claim 1, wherein the thermoplastic toner contains an amorphous resin and a crystalline resin.

5. The method for producing a circuit board according to claim 4, wherein a toner particle of the thermoplastic toner includes a core containing the amorphous resin and the crystalline resin and a coating portion containing an amorphous resin.

6. The method for producing a circuit board according to claim 5, wherein in the core containing the amorphous resin and the crystalline resin, a lower limit of content of the crystalline resin is 15 mass % or more relative to a total amount of resin contained in the core.

7. The method for producing a circuit board according to claim 6, wherein in the core containing the amorphous resin and the crystalline resin, an upper limit of the content of the crystalline resin is 50 mass % or less relative to the total amount of resin contained in the core.

8. The method for producing a circuit board according to claim 1, wherein the heating the formed toner image and the conductive foil layer comprises heating the formed toner image and the conductive foil layer at a temperature of 60° C. or higher, the method further comprising applying a pressure of 1 MPa or less to the formed toner image and the conductive foil layer while the formed toner image and the conductive foil layer are heated.

9. The method for producing a circuit board according to claim 1, wherein the forming the conductive foil layer having a thickness of 0.1 μm to 2 μm on the formed toner image comprising transferring the conductive foil layer having a thickness of 0.1 μm to 2 μm on a film support onto the formed toner image.

10. The method for producing a circuit board according to claim 9, further comprising separating a release layer from the conductive foil layer when the conductive foil layer is transferred, wherein the release layer is disposed between the conductive foil layer and the film support.

11. The method for producing a circuit board according to claim 1, wherein the forming the toner image on the substrate comprises: transferring the toner image on the substrate and fixing the toner image to the substrate.

12. The method for producing a circuit board according to claim 1, wherein a volume average particle diameter (D50v) of the toner particles is 2 micrometers or more and 10 micrometers or less.

13. The method for producing a circuit board according to claim 1, wherein the conducive foil layer comprises gold, silver, copper, or aluminum.

14. A method for producing an integrated circuit, comprising:
- producing a circuit board, comprising:
  - providing a substrate;
  - forming a toner image on the substrate using a thermoplastic toner, wherein the thermoplastic toner contains toner particles in which a volume ratio of particles having a particle diameter of 16 μm or more is 1% or less relative to a total volume of the toner particles; and
  - forming a conductive foil layer having a thickness of 0.1 μM to 2 μm on the formed toner image on the substrate and simultaneously heating the formed toner image and the conductive foil layer to form a conductive wire constituted by the conductive foil layer; and
- attaching a semiconductor device to the produced circuit board.

\* \* \* \* \*